United States Patent [19]
Ushirogouchi et al.

[11] Patent Number: 6,071,670
[45] Date of Patent: Jun. 6, 2000

[54] TRANSPARENT RESIN, PHOTOSENSITIVE COMPOSITION, AND METHOD OF FORMING A PATTERN

[75] Inventors: Toru Ushirogouchi; Takeshi Okino, both of Yokohama; Naomi Shida, Kawasaki; Makoto Nakase, Tokyo; Yoshiaki Kawamonzen, Kawasaki; Rumiko Hayase, Yokohama; Koji Asakawa, Kawasaki, all of Japan

[73] Assignee: Kabushiki Kaisha Toshiba, Kawasaki, Japan

[21] Appl. No.: 08/948,425

[22] Filed: Oct. 10, 1997

[30] Foreign Application Priority Data

Oct. 11, 1996 [JP] Japan .................................. 8-269758

[51] Int. Cl.[7] ....................................................... G03F 7/004

[52] U.S. Cl. ........................ 430/270.1; 430/325; 430/326; 430/906; 430/908

[58] Field of Search ................................ 430/270.1, 326, 430/325, 906, 908

[56] References Cited

U.S. PATENT DOCUMENTS

| | | | |
|---|---|---|---|
| 5,609,989 | 3/1997 | Bantu et al. ........................ | 430/270.1 |
| 5,843,624 | 12/1998 | Houlihan et al. ....................... | 430/296 |
| 5,879,857 | 3/1999 | Chandross et al. .................. | 430/270.1 |
| 5,928,841 | 7/1999 | Ushirogouchi et al. ................ | 430/325 |
| 5,932,391 | 12/1998 | Ushirogouchi et al. ............. | 430/270.1 |

FOREIGN PATENT DOCUMENTS 3-179355  8/1991  Japan .

OTHER PUBLICATIONS

Koji Nozaki, et al., "A Novel Polymer for a 193–nm Resist", Journal of Photopolymer Science and Technology, vol. 9, No. 3, 1996, pp. 509–522.

*Primary Examiner*—Janet Baxter
*Assistant Examiner*—Rosemary Ashton
*Attorney, Agent, or Firm*—Oblon, Spivak, McClelland, Maier & Neustadt, P.C.

[57] ABSTRACT

A photosensitive composition comprising, an oligomer having a backbone chain comprising an alicyclic skeleton and/or a conjugated polycondensed aromatic skeleton, the backbone chain being acid-decomposable or hydrolyzable, and a photo-acid-generating agent.

43 Claims, 2 Drawing Sheets

TRANSPARENT RESIN, PHOTOSENSITIVE COMPOSITION, AND METHOD OF FORMING A PATTERN

BACKGROUND OF THE INVENTION

This invention relates to a photosensitive composition which is useful for a fine working in the manufacture of for example a semiconductor element, a TFT (thin film transistor), a photo-disk, etc and method of forming a pattern using the photosensitive composition. Further, this invention relates to a transparent resin useful for optical material or coating material.

In the manufacture of electronic parts such as an LSI, a fine working technique utilizing a photolithography has been employed. In this fine working technique, a resist film is first formed by coating a resist solution onto a semiconductor substrate for instance. The resist film thus formed is then exposed to light through a prescribed mask pattern, and subsequently subjected to various treatments including an alkali-development, thereby forming a resist pattern. This resist pattern is then utilized as an etching resistant mask in a dry etching process, and the exposed portions of the substrate are etched away to form a pattern of fine line or window thereby obtaining a desired pattern. Finally, the resist pattern remaining on the substrate is removed through ashing.

Therefore, the resist to be employed in this process is generally required to have a high dry-etching resistance. In view of this requirement, a resist comprising an aromatic compound has been extensively employed. For example, many kinds of resists comprising an alkali-soluble novolak resin as a base resin have been developed up to date.

In view of a trend in recent years to further increase the integration of semiconductor elements such as seen in an LSI, the aforementioned fine working technique in recent years has been advanced to such a degree that makes it possible to realize a fine pattern of the order of sub-half micron. It is expected that this trend to increase the integration of semiconductor elements becomes more prominent in future. In order to meet such a trend, the use of light source of shorter wavelength in photolithography is now being studied. For example, a method for forming a finer resist pattern through the use of ArF excimer laser (193 nm in wavelength) or the quintuple harmonic of YAG laser (218 nm in wavelength) has been tried at present.

However, the aforementioned conventional resist comprising a novolak resin as a base resin which has been generally employed up to date is generally characterized by its prominent absorption of the light of short wavelength at the benzene nucleus of the novolak resin. Therefore, it is impossible, because of this prominent light absorption, to allow the exposure light to reach deep enough to an interface between the resist film and the substrate. As a result, it has been very difficult to form a fine pattern of excellent shape while assuring high sensitivity and high precision.

As mentioned above, since the resist comprising a novolak resin as a base resin is insufficient in transparency to the light of short wavelength in spite of its excellent dry-etching resistance and alkali-developing properties, it is now strongly demanded to develop a new resist which is suited for use in a photolithography where the ArF excimer laser (193 nm) or the quintuple harmonics of YAG laser (218 nm) can be employed.

In view of this, a resist where an alicyclic compound is employed in place of an aromatic compound is recently attracting many attentions. For example, as one example of a resist which is excellent in dry etching resistance and in transparency to a light of short wavelength, a resist comprising a polymer having an adamantine skeleton as a base resin thereof is proposed in Japanese Patent Unexamined Publication H/4-39665. This patent publication also discloses an example where a compound having an adamantine skeleton is copolymerized with an acrylic compound having a carboxylic group to provide a copolymer having an alkali-solubility, which is then subjected to an alkaline development to form a resist pattern.

However, there are various problems that will be encountered in a process of forming a resist pattern through an alkaline development of a resist comprising an alicyclic compound, because the alkali-solubility of an alicyclic structure such as the adamantine skeleton differs greatly from that of carboxylic group. For example, the solubility and removal of a given region of a resist film may become non-uniform at the occasion of development, thereby inviting not only the deterioration of resolution, but also a partial dissolution even in a region of the resist film which is originally intended to be kept unremoved, whereby causing a generation of cracks or surface roughening in that region of a resist film. Moreover, an alkali solution may penetrate into an interface between the resist film and the substrate, thereby causing a peeling of the resist pattern. Additionally, a phase separation between the alicyclic structure portion and the carboxylic group portion of the polymer may more likely take place, thus making it difficult to prepare a homogeneous resist solution and to obtain a resist solution having a satisfactory coating property.

Moreover, due to a high polymerizability which is peculiar to an alkaline resist, the aforementioned polymer is prone to be further polymerized. When the molecular weight of this polymer is increased excessively, the alkali-solubility thereof would be greatly deteriorated, thus making it difficult to obtain an alkali-soluble resin exhibiting a sufficient solubility for use as a resist. On the other hand, if the molecular weight of the polymer is decreased so as to improve the solubility thereof, not only the transparency of the resist, but also the adhesivity of pattern after the development thereof would be deteriorated. Moreover, the dry-etching resistance of a pattern of the polymer when the pattern is subjected to any of various dry etching processes is inferior as compared with a resist comprising an aromatic compound.

BRIEF SUMMARY OF THE INVENTION

Therefore, the object of the present invention is to provide a photosensitive composition, which is excellent in transparency to the light of short wavelength, in dry etching resistance and in alkali-solubility while exhibiting a high dissolution contrast after light exposure, and capable of forming a fine resist pattern which is high in resolution.

Another object of this invention is to provide a transparent resin which is suited for use as an optical material or as a coating material.

Further object of this invention is to provide a method of forming a pattern, which enables to form a resist pattern, which is excellent in dry etching resistance and high in dissolution contrast and hence high in resolution, by making use of an alkaline development.

According to this invention, there is provided a photosensitive composition comprising; an oligomer having a backbone chain comprising an alicyclic skeleton and/or a conjugated polycondensed aromatic skeleton, the backbone chain being acid-decomposable or hydrolyzable; and a photo-acid-generating agent.

According to this invention, there is further provided a photosensitive composition comprising; a compound comprising an alicyclic skeleton having carboxyl group and hydroxyl group, or a conjugated polycondensed aromatic skeleton having carboxyl group and hydroxyl group; and a compound capable of generating an acid when irradiated with an actinic radiation.

According to this invention, there is further provided a transparent resin comprising an ester oligomer having a hydroxy cholane skeleton, a polyisocyanate having a hydroxy cholane skeleton, or an oligomer represented by the following general formula (11);

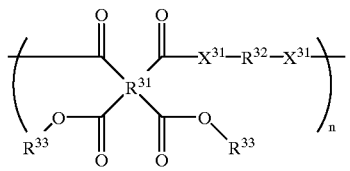
(11)

wherein $X^{31}$ is NH or O; $R^{31}$ is a tetra-valent organic group having an alicyclic skeleton or a conjugated polycondensed aromatic skeleton; $R^{32}$ is a bi-valent organic group having an alicyclic skeleton or a conjugated polycondensed aromatic skeleton; $R^{33}$ is hydrogen atom or mono-valent organic group; and n is an integer.

According to this invention, there is further provided a method of forming a resist pattern, which comprises the steps of:

forming a resin layer comprising any one of the aforementioned photosensitive compositions on a substrate;
irradiating an actinic radiation onto a predetermined region of the resin layer;
heat-treating the resin layer irradiated with the actinic radiation; and
developing the resin layer after the heat-treatment so as to selectively remove an irradiated portion or un-irradiated portion of the resin layer.

The ester oligomer to be employed in this invention can be synthesized by melting a monomer thereof and then by subjecting the monomer to dehydrating condensation.

Alternatively, the ester oligomer to be employed in this invention can be synthesized by a method comprising the steps of:

reacting tetracarboxylic dihydrate having an alicyclic skeleton or a conjugated polycondensed aromatic skeleton with a metal salt of mono-valent aliphatic alcohol or with a metal salt of alcohol having a mono-valent alicyclic skeleton or a conjugated polycondensed aromatic skeleton to obtain a mono- or di-carboxylate; and
reacting the mono- or di-carboxylate with epoxide having an alicyclic skeleton or a conjugated polycondensed aromatic skeleton in a presence of a base.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
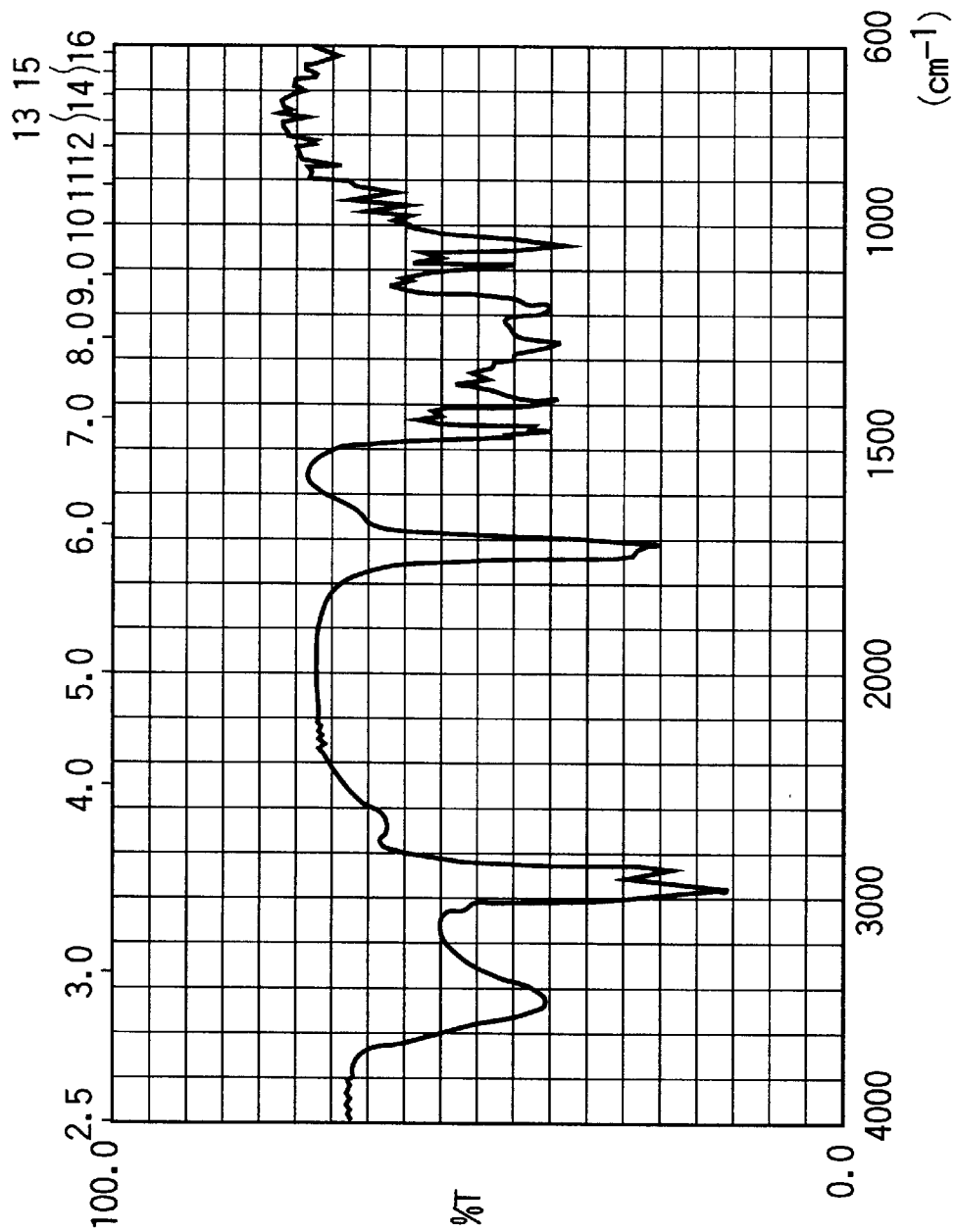
FIG. 1 shows an infrared absorption spectrum of an oligomer which has been synthesized in Example 31.

The photosensitive composition of this invention is featured in that the decomposition of molecular skeleton including the backbone chain of resin takes place before and after a light exposure of the photosensitive composition. According to the photosensitive composition of this invention, this decomposition system of backbone chain and at least one of the skeletons selected from an alicyclic skeleton and a conjugated polycyclic condensed aromatic skeleton are introduced into the backbone chain of a polymer for the purpose of prominently improving the solubility of the exposure portion of a resist film while assuring an excellent coating property and adhesivity of the resist film, thus improving a dissolution contrast between the irradiated portion (exposed portion) and the un-irradiated portion (un-exposed portion) of the resist film. Moreover, since at least one of the skeletons selected from an alicyclic skeleton and a conjugated polycyclic condensed aromatic skeleton is introduced into the backbone chain of a resist, it is possible to assure a sufficient dry etching resistance of the photosensitive composition.

This invention will be further explained in detail as follows.

As for the alicyclic skeleton to be contained in the backbone chain of the oligomer, a cyclic compound represented by a general formula $C_nH_{2n}$ (n is an integer of 3 or more), bicyclic compound, tricyclic compound, and condensed rings of these cyclic compound can be employed. Specific examples thereof include cyclobutane; cyclopentane; cyclohexane; cycloheptane; any of above-mentioned monocyclic compounds attached with a bridging hydrocarbon; a spiro ring such as spiroheptane or spirooctane; a terpene ring such as norbornyl, adamanthyl, bornene, menthyl or menthane; a steroid skeleton such as thujane, sabinene, thujone, carane, carene, pinane, norpinane, bornane, fenchane, tricyllene or cholesteric ring; bile acid; digitaloid; camphoric ring; isocamphoric ring; sesquiterpene; santonic ring; diterpene; triterpene; and steroidsaponin.

Specific examples of the conjugated polycyclic condensed aromatic skeleton are compounds having any of naphthalene ring, anthracene ring, phenanthrene ring, pyrene ring, naphthacene ring, chrysene ring, 3,4-benzophenanthrene ring, perylene ring, pentacene ring, picene ring, pyrrole ring, benzofuran ring, benzothiophene ring, indole ring, benzoxazole ring, benzothiazole ring, indazole ring, chromene ring, quinoline cinnoline ring, phthalazine ring, quinazoline ring, dibenzofuran ring, carbazole ring, acridine ring, phenanthridine ring, phenanthroline ring, phenazine ring, thianthrene ring, indolizine ring, naphthyridine ring, purine ring, pteridine ring and fluorene ring.

Among them, a conjugated polycyclic condensed aromatic skeleton having a naphthalene ring, an anthracene ring or a phenanthrene ring is more preferable.

Although it is possible according to this invention to obtain a desired effect even with the employment of an oligomer having only a conjugated polycyclic condensed aromatic skeleton on its backbone chain, the employment of an oligomer having a combination of a conjugated polycyclic condensed aromatic skeleton and an alicyclic skeleton is more preferable in terms of improving transparency of the oligomer. The employment of an oligomer having only a conjugated polycyclic condensed aromatic skeleton on its backbone chain is also preferable in terms of dry etching resistance and alkali-solubility.

It is preferable to formulate the oligomer in view of provide the oligomer with acid-decomposability such that, in addition to a chain structure comprising a linkage of the alicyclic skeleton and/or the conjugated polycyclic condensed aromatic skeleton (hereinafter referred to as a backbone chain constituent skeleton), the backbone chain constituent skeleton is linked with each other via an acid-decomposable linkage. Examples of such an acid-decomposable linkage are an acetal linkage, a silanol linkage, an amide linkage, an imino linkage, a urethane linkage, an ester linkage and an acid anhydride linkage. These linkages can be formed as follows.

If an acetal linkage is to be formed, a compound having a polyvalent aldehyde on its backbone chain constituent skeleton is condensed by making use of a Lewis acid catalyst to produce a polyacetal compound, or otherwise, a backbone chain constituent skeleton having a plurality of hydroxyl groups or carboxyl groups is subjected to a condensation reaction with a divinyl ether-based compound having a plurality of double bonds by making use of an acid catalyst.

If a silanol linkage is to be formed, silane halide is added to a compound having a plurality of hydroxyl groups on its backbone chain constituent skeleton, and is then subjected to a dehalogenation condensation reaction by making use of a basic catalyst to form a polysilanol compound.

If an imino linkage or an amide linkage is to be formed, a polyvalent carboxylic acid having a backbone chain constituent skeleton or a polyvalent aldehyde having a backbone chain constituent skeleton is subjected to a dehydration condensation reaction with a polyvalent amino compound, or otherwise, a polyvalent amine having a backbone chain constituent skeleton is subjected to a dehydration condensation reaction with a polyvalent aldehyde or with a polyvalent carboxylic acid compound.

If a urethane linkage is to be formed, a polyvalent carboxylic acid having a backbone chain constituent skeleton or a polyvalent hydroxy compound having a backbone chain constituent skeleton is allowed to react with a polyvalent isocyanate compound, or otherwise, a polyvalent isocyanate compound having a backbone chain constituent skeleton is reacted with a polyvalent carboxylic acid or with a polyhydroxy compound.

If an ester linkage is to be formed, a polyvalent carboxylic acid having a backbone chain constituent skeleton is subjected to a dehydration condensation reaction with a polyvalent alcoholic compound, or otherwise, a polyvalent alcohol having a backbone chain constituent skeleton is reacted with a polyvalent carboxylic acid or with a polyvalent acid anhydride. Alternatively, a polyvalent carboxylic acid having a backbone chain constituent skeleton is subjected to a dehydration condensation reaction with at least one kind of compound having a polyvalent alcoholic group. Further, in stead of dehydration condensation reaction, the ester linkage may be formed by condensing alchole with acid chloride using basic catalyst.

If an acid anhydride linkage is to be formed, at least one kind of polyvalent carboxylic acid compound having a backbone chain constituent skeleton is subjected to a dehydration condensation reaction. Alternatively, the acid anhydride linkage may be formed by condensing acid chloride with acid using basic catalyst.

A plural kinds of these linkages (for example, an ester linkage and an acid anhydride linkage) may coexist concurrently in an oligomer if these linkages are formed through a reaction of the same kind, in particular through a dehydration condensation reaction.

A linkage to be formed through a dehydration may be generally carried out by making use of heating or an acid catalyst. The dehydration condensation reaction may be carried out by the employment, as a condensation agent, cyclohexyl carbodiimide, polyethyl phosphate which is set forth in "Organosynthetic Chemistry Vol. 48, No. 2, pp. 144–156 (1990)", polytrimethylsilyl phosphate, polyphosphoric acid, a mixture of phosphorus pentaoxide and methane sulfonic acid, or any of the compounds represented by the following formulas (1) to (4).

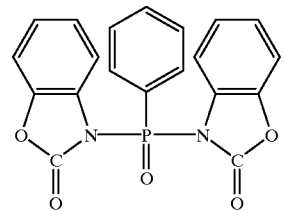

(1)

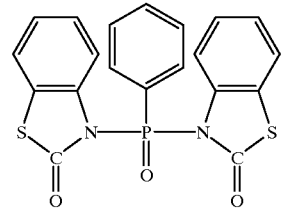

(2)

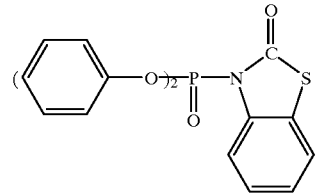

(3)

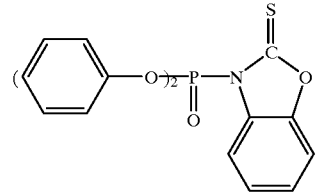

(4)

When the oligomer to be incorporated into a photosensitive composition of this invention is formed through a dehydration condensation reaction between a carboxyl group and a hydroxyl group and/or between carboxyl groups, the resultant oligomer would be excellent not only in acid decomposability, but also in stability and transparency, and desirable in view of easiness in synthesis.

Specific examples of the oligomer that can be formed through a dehydration condensation reaction between a carboxyl group and a hydroxyl group and/or between carboxyl groups are those which can be obtained by way of a dehydration condensation reaction among the compounds represented by the following general formulas (5), (6) and (7).

$$HOOC—R^1—COOH \quad (5)$$

$$HO—R^2—OH \quad (6)$$

$$HO—R^3—COOH \quad (7)$$

wherein $R^1$, $R^2$ and $R^3$ are individually a bivalent organic group (alternatively, $R^2$ may be a bi-valent Si-containing group); and at least one group selected from $R^1$, $R^2$ and $R^3$ in the oligomer is an alicyclic group or a conjugated polycyclic condensed aromatic group. For example, a compound to be formed through a dehydration condensation reaction between at least one kind of compounds selected from the compounds represented by the general formulas (5) and (6) and a compound represented by the general formula (7) may be employed as the oligomer. Alternatively, at least one kinds of compounds represented by the general formula (7) may be subjected to a dehydration condensation reaction to form the oligomer.

The aforementioned $R^1$, $R^2$ and $R^3$ may contain a plurality of carboxyl groups or hydroxyl groups, and, when these $R^1$, $R^2$ and $R^3$ contain carboxyl groups, they may be formed into an acid anhydride within the molecule.

The oligomer to be obtained may contain an acid anhydride or a cyclic lactone compound, which is to be formed through a reaction between a plurality of carboxylic acids and a polyvalent alcohol. Specifically, the oligomer may contain a cyclic lactone structure represented by the following general formula (8).

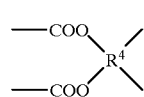

(8)

wherein $R^4$ is a carbon atom.

Specific examples of the compounds represented by the aforementioned general formula (5) are oxalic acid, malonic acid, succinic acid, adipic acid, glutaric acid, pimelic acid, suberic acid, azelaic acid, sebasic acid, brassilic acid, methyl malonic acid, tetramethyl succinic acid, fumaric acid, citraconic acid, acetylene dicarboxylic acid, maleic acid, methyl maleic acid, mesaconic acid, glutaconic acid, itaconic acid, alyl malonic acid, tetraconic acid, muconic acid, butyne diacid, tricarballylic acid, aconitic acid, camphoronic acid, chlorosuccinic acid, bromosuccinic acid, 2,3-dibromosuccinic acid, chloromaleic acid, chlorofumaric acid, bromomaleic acid, bromofumaric acid, tartronic acid, malic acid, acetoxysuccinic acid, citramalic acid, tartaric acid, racemic acid, tetrahydroxysuccinic acid, citric acid, desoxalic acid, diglycolic acid, oxomaleic acid, oxosuccinic acid, acetoxydicarboxylic acid, hydrochelidonic acid, thiomalic acid, cystine, aminosuccinic acid, asparagine, glutamic acid, β-hydroxyglutamic acid, iminodiacetic acid, nitrilotriacetic acid, ethylenediamine tetraacetic acid, disodium ethylenediamine tetraacetate, dithioglycolic acid, 1,1-cyclopropane dicarboxylic acid, 1,2-cyclopropane dicarboxylic acid, 1,1-cyclobutane dicarboxylic acid, truxillic acid, truxinic acid, 1,2-cyclohexane dicarboxylic acid, 1,3-cyclohexane dicarboxylic acid, 1,4-cyclohexane dicarboxylic acid, 1-cyclohexene-1,2-dicarboxylic acid, 2-cyclohexene-1,4-dicarboxylic acid, cineolic acid, camphoric acid, isocamphoric acid, camphoronic acid, isocamphoronic acid, phthalic acid, isophthalic acid, terephthalic acid, 5-methylisophthalic acid, hemimellitic acid, trimellitic acid, trimesic acid, prehnitic acid, mellophanic acid, pyromellitic acid, benzene pentacarboxylic acid, mellitic acid, chlorophthalic acid, dichlorophthalic acid, tetrachlorophthalic acid, nitrophthalic acid, nitroisophthalic acid, nitroterephthalic acid, hydroxyphthalic acid, hydroxyisophthalic acid, hydroxyterephthalic acid, norhemipinic acid, 2,5-dihydroxyterephthalic acid, phenol-2,4,6-tricarboxylic acid, benzophenone dicarboxylic acid, phenyl succinic acid, homophthalic acid, o-phenylene diacetic acid, benzylidene malonic acid, o-carboxy silicic acid, phthalonic acid, o-carboxyanilinoacetic acid, o-carboxyoxanilic acid, azobenzene dicarboxylic acid, azoxybenzene dicarboxylic acid, 2,2'-hydrazobenzene dicarboxylic acid, diphenic acid, 2,2'-benzidine dicarboxylic acid, o-cresol phthalein complexon, xylenol orange, naphthalic acid, alizarin complexon, dehydromucic acid, chelidonic acid, meconic acid, pyridine carboxylic acid, D-glucaric acid and galactalic acid. It is also possible to employ a hydrogenated or substituted product of these compounds.

Examples of the compound where $R^1$ is an alicyclic group or a conjugated polycyclic condensed aromatic group are cyclobutane dicarboxylic acid, camphoric acid, norbornane dicarboxylic acid derivative, 1,1-cyclopropane dicarboxylic acid, 1,2-cyclopropane dicarboxylic acid, 1,1-cyclobutane dicarboxylic acid, 1,2-cyclohexane dicarboxylic acid, 1,3-cyclohexane dicarboxylic acid, 1,4-cyclohexane dicarboxylic acid, 1-cyclohexene-1,2-dicarboxylic acid, 2-cyclohexene-1,4-dicarboxylic acid, camphoric acid, isocamphoric acid, camphoronic acid, isocamphoronic acid, endomethylene tetrahydrophthaloylic acid, adamantane dicarboxylic acid derivatives, cyclohexane dicarboxylic anhydride, cyclobutane tetracarboxylic anhydride, hydrated pyromellitic anhydride, naphthalene dicarboxylic acid derivatives and anthracene dicarboxylic acid derivatives.

Specific examples of the compounds represented by the aforementioned general formula (6) are glycol, propylene glycol, trimethylene glycol, monochlorohydrin, butylene glycol, pentamethylene glycol, pinacol, butynediol, dihydroxyacetone dimer, glyceline, pentaglycerol, pentaerythritol and dioxane diol. Examples of the compound where $R^2$ is an alicyclic group or a conjugated polycyclic condensed aromatic group are cyclohexane diol, fluoroglucitol, inositol, bicyclodecane diol derivatives, pinane diol, menthane diol, menthene diol, adamantane diol, betulin, digitaloid lactone, dihydroxy naphthalene derivatives and dihydroxyanthraquinone derivatives.

Specific examples of the compounds represented by the aforementioned general formula (7) are glycolic acid, lactic acid, hydroxybutyric acid, hydroxymethyl propanic acid, hydroxypentanecarboxylic acid, glyceric acid, tartronic acid, malic acid, tartaric acid, racemic acid and citric acid. Examples of the compound where $R^3$ is an alicyclic group or a conjugated polycyclic condensed aromatic group are hydroxycholane acid derivatives such as cholic acid and deoxycholic acid, oleanolic acid, naphthol carboxylic acid derivatives, hydroxy anthracene carboxylic acid derivatives, etc.

Although an oligomer containing an acid anhydride linkage has an advantage that it is excellent in alkali-solubility, an acid anhydride linkage-containing compound of this kind is generally considered to be vulnerable to hydrolysis and hence poor in stability. However, the acid anhydride linkage in an oligomer to be employed in this invention is sandwiched between bulky backbone chain constituent skeletons such as alicyclic compounds or conjugated polycyclic condensed aromatic compounds, so that the stability of the oligomer is prominently improved, while assuring a suitable alkali-solubility which is required in the formation of a pattern. On the other hand, an oligomer having an ester linkage is excellent in stability irrespective of the kind of solvent and exhibits a large change in solubility when it is decomposed by an acid catalyst, thus making the oligomer advantageous in that an enhanced resolution of pattern can be obtained.

When these acid anhydride linkage and ester linkage are concurrently employed in an oligomer, an oligomer excellent in both solubility and resolution and more suited for use as a resist can be obtained. In this case, the ratio between the acid anhydride linkage and the ester linkage should desirably be within the range of 1:20 to 5:1, and the ratio of the acid anhydride linkage in the entire linkages should preferably be in the range of from 10% to less than 50%. If the ratios of these acid anhydride linkage and ester linkage fall outside these ranges, the sensitivity and alkali-solubility of the oligomer would be deteriorated.

The photosensitive composition according to this invention may contain a large quantity of carboxyl groups attached to the side chains of the resin. In that case, part or whole of the carboxyl groups may be substituted by a protective group which can be decomposed by an acid to be explained hereinafter.

An oligomer having a silanol linkage or a cyclic lactone linkage is excellent in alkali-solubility and these linkages are more stable than the aforementioned acid anhydride linkage, so that an oligomer having only silanol linkage or cyclic lactone linkage can be employed to obtain a desired effect. However, when these silanol linkage and cyclic lactone linkage are employed in combination with an ester linkage, more excellent solubility and resolution which are desirable for a resist can be obtained. In this case, the ratio of silanol linkage or cyclic lactone linkage should preferably be within the range of from 20% to less than 100%.

The carbon atom to which at least one hydroxyl group is linked in the compounds represented by the aforementioned general formulas (6) and (7) should preferably be a tertiary carbon comprising at least methyl group. Because if this carbon atom is formed of a tertiary carbon, water molecule would not be required to be supplied in a decomposition of the compounds by acidic catalyst.

The ratio of the alicyclic skeleton in the oligomer should preferably be 20 to 90 wt % based on the oligomer. If the ratio of the alicyclic skeleton falls outside this range, the dry etching resistance and alkali-solubility of the oligomer may be deteriorated. The ratio of the conjugated polycyclic condensed aromatic skeleton in the oligomer should preferably be 0 to 50 wt % based on the oligomer. If the ratio of the conjugated polycyclic condensed aromatic skeleton exceeds over 50 wt %, the transparency of the resist to a light of short wavelength may be deteriorated. Since the absorbency of the oligomer to a light of 193 nm in wavelength should preferably be confined to 5 or less per 1 $\mu$m in this invention, it is desirable to determine the content of the conjugated polycyclic condensed aromatic skeleton with a view to assure this range of absorbency.

The average molecular weight of the aforementioned oligomer should preferably be set to a range of 100 to 10,000 in this invention. Because if the average molecular weight of the oligomer is less than 100, it may become difficult to form a resist film having a sufficient mechanical strength and being excellent in heat resistance and coating property. On the other hand, if the average molecular weight of the oligomer exceeds over 10,000, the alkali-solubility thereof may be deteriorated so that it may become difficult to form a resist pattern excellent in resolution.

These compounds are generally formed of a mixture consisting of components of various degrees of molecular weight. However, even a component of relatively low molecular weight such as a dimer is capable of exhibiting an effect in this invention. For example, even if these compounds are mainly consisted of components having an average molecular weight of 100 to 1,000, the solubility of these compounds would be improved. Furthermore, even if monomers are left remained in an oligomer at a ratio of up to less than 10%, the solubility and dry etching resistance of the oligomer would not be badly affected. A preferable content of the aforementioned oligomer in the compound in this invention is in the range of 20 wt % to 100 wt %. If the content of the aforementioned oligomer is less than 20 wt %, the alkali-solubility of the compound may be deteriorated.

When a protective group is introduced into a side chain of a oligomer, the contrast in solubility would be further enhanced. The introduction of a protective group into a side chain can be carried out by protecting carboxyl group remaining in the oligomer with an acid-decomposable group.

The acid-decomposable group that can be employed herein is an ester compound to be derived by a reaction with carboxylic acid.

Specific example of the acid-decomposable group are esters such as isopropyl ester, tetrahydropyranyl ester, tetrahydrofuranyl ester, methoxyethoxymethyl ester, 2-trimethylsilylethoxymethyl ester, 3-oxocyclohexyl ester, isobornyl ester, trimethylsilyl ester, triethylsilyl ester, isopropyldimethylsilyl ester, di-t-butylmethylsilyl ester, oxazole, 2-alkyl-1,3-oxazoline, 4-alkyl-5-oxo-1,3-oxazoline and 5-alkyl-4-oxo-1,3-dioxsolane; ethers such as t-butoxycarbonyl ether, t-butoxymethyl ether, 4-pentenyloxymethyl ether, tetrahydropyranyl ether, 3-bromotetrahydropyranyl ether, 1-methoxycyclohexyl ether, 4-methoxytetrahydropyranyl ether, 4-methoxytetrahydrothiopyranyl ether, 1,4-dioxan-2-yl ether, tetrahydrofuranyl ether, 2,3,3a,4,5,6,7,7a-octahydro-7,8,8-trimethyl-4,7-methanobenzofuran-2-yl ether, t-butyl ether, trimethylsilyl ether, triethylsilyl ether, triisopropylsilyl ether, dimethylisopropylsilyl ether, diethylisopropylsilyl ether, dimethylcexylsilyl ether and t-butyldimethylsilyl ether; acetals such as methylene acetal, ethylidene acetal, 2,2,2-trichloroethylidene acetal, 2,2,2-tribromoethylidene acetal and 2,2,2-triiodoethylidene acetal; ketals such as 1-t-butylethylidene ketal, isopropylidene ketal (acetonide), cyclopentylidene ketal, cyclohexylidene ketal and cycloheptylidene ketal; cyclic ortho-esters such as methoxymethylene acetal, ethoxymethylene acetal, dimethoxymethylene ortho-ester, 1-methoxyethylidene ortho-ester, 1-ethoxyethylidene ortho-ester, 1,2-dimethoxyethylidene ortho-ester, 1-N,N-dimethylaminoethylidene ortho-ester and 2-oxacyclopentylidene ortho-ester; silylketene acetals such as trimethylsilylketene acetal, triethylsilylketene acetal, triisopropylsilylketene acetal and t-butyldimethylsilylketene acetal; silyl ethers such as di-t-butylsilyl ether, 1,3-1',1',3', 3'-tetraisopropyldisiloxanylidene ether and tetra-t-buthoxydisiloxane-1, 3-diylidene ether; acyclic acetals or ketals such as dimethyl acetal, dimethyl ketal, bis-2,2,2-trichloroethyl acetal, bis-2,2,2-tribromoethyl acetal, bis-2,2,2-triiodoethyl acetal, bis-2,2,2-trichloroethyl ketal, bis-2,2,2-tribromoethyl ketal, bis-2,2,2-triiodoethyl ketal, diacetyl acetal and diacetyl ketal; cyclic acetals or cyclic ketals such as 1,3-dioxane, 5-methylene-1,3-dioxane, 5,5-dibromo-1,3- dioxane, 1,3-dioxolane, 4-bromomethyl-1,3-dioxorane, 4-3'-butenyl-1,3-dioxorane and 4,5-dimethoxymethyl-1,3-dioxoran; cyanohydrines such as o-trimethylsilyl cyanohydrine, o-1-ethoxyethyl cyanohydrine and o-tetrahydropyranyl cyanohydrine.

When a resin having any of the aforementioned acid-decomposable groups are to be employed in the photosensitive composition of this invention, the content of the resin should preferably be restricted to 10 to 99.5 wt % based on the solid matters in the photosensitive composition. Because, if the content of the resin is less than 10 wt %, the coating properties of the photosensitive composition is liable to be deteriorated, whereas if the content of the resin exceeds over 99.5 wt %, it may become difficult to obtain a photosensitive composition having a sufficient sensitivity. Among the aforementioned oligomers, a compound represented by the following general formula (9) is preferable in view of easiness in synthesis and excellence in productivity, though the decomposability of its backbone chain is somewhat poor.

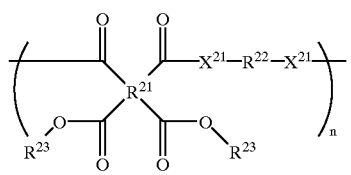

(9)

wherein $X^{21}$ is oxygen atom; $R^{21}$ is a tetra-valent organic group having an alicyclic skeleton or a conjugated polycondensed aromatic skeleton; $R^{22}$ is a bi-valent organic group having an alicyclic skeleton or a conjugated polycondensed aromatic skeleton; $R^{23}$ is hydrogen atom or mono-valent organic group; and n is an integer.

As for the alicyclic skeleton and the conjugated polycondensed aromatic skeleton that can be introduced into $R^{21}$ and $R^{22}$ in the oligomer having a repeating unit represented by the aforementioned general formula (9), the same kind of structures as explained above can be employed. As for the mono-valent organic group to be introduced as $R^{23}$, there is any particular limitation, specific examples thereof being methyl, ethyl, n-propyl, iso-propyl, n-butyl, tert-butyl, sec-butyl, adamantyl, furyl and pyranyl group.

The resin of this kind can be synthesized as follows. Namely, tetracarboxylic dianhydride having an alicyclic structure and a dihydroxy compound having an alicyclic structure are mixed in a prescribed polar solvent thereby to obtain a polyester.

Specific examples of the tetracarboxylic dianhydride having an alicyclic structure are cyclobutane tetracarboxylic dianhydride, 1,2,3,4-cyclopentane tetracarboxylic dianhydride, 1,2,4,5-cyclohexane tetracarboxylic dianhydride, and compounds represented by the following chemical formulas.

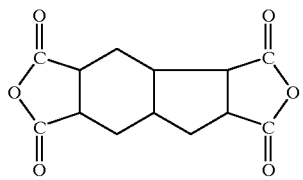

-continued

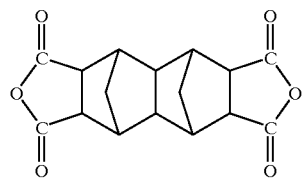

Examples of polar solvent useful herein are aprotic solvents such as N-methyl pyrrolidone, N,N-dimethyl acetamide, N,N-dimethyl formamide, dimethyl sulfoxide, etc.

Then, to the resultant reaction solution, 3,4-dihydro-2H-pyrane or dihydrofuran and a catalytic amount of hydrochloride are added, the resultant mixture being agitated thereby allowing a reaction to take place. After this reaction, the solution is dripped into a solvent such as methanol, ethanol, water, hexane, etc. thereby allowing a polymer to precipitate. Thereafter, the resultant polymer is taken out through filtration and then dried to obtain an aimed polymer.

The compound represented by the aforementioned general formula (9) may be synthesized according to the following method. Namely, tetracarboxylic dianhydride having an alicyclic structure and a monovalent metal alkoxide are allowed to react with each other in an organic solvent such as THF or acetone thereby to obtain dicarboxylic diester. Then, the dicarboxylic diester thus obtained is separated from the reaction solution and mixed and reacted with a dihydroxy compound having an alicyclic structure in the presence of a basic catalyst such as triethyl amine or pyridine thereby to carry out the polymerization. Then, insoluble matters in the reaction mixture are removed by way of filtration. The filtrate thus obtained is dripped into a solvent such as methanol, ethanol, water, hexane, etc. thereby allowing a polymer to precipitate. Finally, the resultant polymer is taken out through filtration and then dried to obtain an aimed polymer.

Examples of the metal alkoxide use in this case are potassium methoxide, sodium methoxide, potassium ethoxide, sodium ethoxide, potassium-tert-butoxide, sodium-tert-butoxide, potassium salt of 1-adamantanol, sodium salt of 1-adamantanol, etc. As for the condensation agent, the compounds as mentioned above can be suitably employed. Namely, cyclohexyl carbodiimide, polyethyl phosphate which is set forth in "Organosynthetic Chemistry Vol. 48, No. 2, pp. 144–156 (1990)", polytrimethylsilyl phosphate, polyphosphoric acid, a mixture of phosphorus pentaoxide and methane sulfonic acid, or any of the compounds represented by the aforementioned formulas (1) to (4).

The compound represented by the aforementioned general formula (9) may be synthesized also according to the following method. Namely, tetracarboxylic dianhydride having an alicyclic structure and a metal alkoxide are allowed to react with each other in an organic solvent such as N-methyl pyrrolidone, N,N-dimethyl acetamide, N,N-dimethyl formamide, dimethyl sulfoxide, tetrahydrofuran, etc. at a temperature ranging from room temperature to 120° C. for 30 minutes to 100 hours. Then, the reaction mixture is poured into water of 2 to 10 times (volume) that of the reaction mixture thereby forming a precipitate, which is then isolated through filtration and dried to obtain dicarboxylic acid diester. If required, the resultant dicarboxylic acid diester is dissolved in diethyl ether for instance to obtain a solution, which is then shaken together with an aqueous diluent solution exhibiting a stronger acidity than the dicarboxylic acid diester. Subsequently, a diethyl ether layer is collected, and then the ether and metallic impurities such as potassium and sodium are removed.

As for the acidic diluent solution to be employed for removing metallic impurities, an aqueous solution of hydrochloric acid, oxalic acid or acetic acid, which is diluted to 0.5 to 5 wt %, may be suitably employed. It is also possible to dissolve the dicarboxylic acid diester in alcohol or THF so as to recrystallize it thereby to refine the dicarboxylic acid diester.

The dicarboxylic acid diester thus obtained is isolated and mixed with diepoxide having an alicyclic structure and also with a basic compound to obtain a mixture, which is then dissolved in a solvent such as N-methyl pyrrolidone, N,N-dimethyl acetamide, N,N-dimethyl formamide, dimethyl sulfoxide, tetrahydrofuran, etc. The resultant mixture is then agitated at a temperature ranging from −20° C. to 150° C. for 30 minutes to 100 hours.

As for the diepoxy compound having an alicyclic structure, compounds represented by the following chemical formulas can be employed.

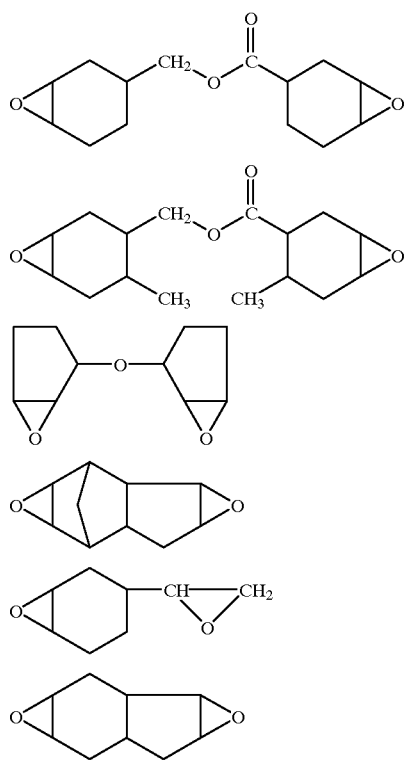

The aforementioned dicarboxylic acid diester and the diepoxide having an alicyclic structure are generally mixed with each other in a stoichiometrically equivalent amount. However, it is also possible, if required, to carry out the reaction by employing an excessive amount of either one of them. It is also possible to carry out the reaction by adding a small amount of an acid anhydride having an alicyclic structure for the purpose of enhancing the $T_g$ of the polymer to be obtained or for the purpose of adjusting the rate of dissolution of the polymer to an alkaline developing solution. It is preferable for the purpose of suppressing gelation to add the acid anhydride after finishing the reaction between the dicarboxylic acid diester and the diepoxy compound having an alicyclic structure, and then to allow the acid anhydride to react with the reaction product at a temperature of 100° C. or less.

Specific examples of the aforementioned basic compound useful in this case are amines such as diethylene diamine, triethylene tetramine, diethylaminopropyl amine, N-aminoethyl piperazine, benzylmethyl amine, tris (dimethylaminomethyl) phenol, metaphenylene diamine, diaminophenyl methane, diaminodiphenyl sulfone, polyamide resin (amine number: 200 to 350), dicyandiamide, boron trifluoride monoethylamine, menthan diamine, xylene diamine, bisaminopropyl tetraoxaspiroundecane adduct and ethylmethyl imidazole; organic phosphine compounds; imidazol compounds or their derivatives; DBU (1,8-diazabicyclo(5,4,0) undecene-7) or salts thereof;

tertiary amines such as benzylmethylamine, α-methylbenzyldimethylamine, dimethylaminophenol and trisdimethylaminomethylphenol. Salts or complex compounds of these basic compounds can be also employed.

Specific examples of organic phosphine compounds are trimethyl phosphine, triethyl phosphine, tributyl phosphine, triphenyl phosphine, tri(p-methylphenyl) phosphine, tri (nonylphenyl) phosphine, methyldiphenyl phosphine, dibutylphenyl phosphine, tricyclohexyl phosphine, 1,2-bis (diphenylphosphine) ethane, and bis(diphenylphosphine) methane.

Specific examples of imidazol compounds are 2-methyl imidazole, 2,4-dimethyl imidazole, 2-ethyl-4-methyl imidazole, 2-phenyl imidazole, 2-phenyl-4-methyl imidazole, and 2-heptadecyl imidazole.

As for phenol salt of DBU, SA-853 (San Apro) may be employed.

After the polymerization reaction, insoluble matters in the reaction mixture are removed by way of filtration. The filtrate thus obtained is dripped into a solvent such as methanol, ethanol, water, hexane, etc. thereby allowing a polymer to precipitate. Finally, the resultant polymer is taken out through filtration and then dried to obtain an aimed polymer.

When aforementioned oligomer is to be employed in a photosensitive composition, the average molecular weight of the oligomer should preferably be set to the range of from 500 to 500,000. If the average molecular weight of the oligomer is less than 500, it would become difficult to form a resist film having a sufficient mechanical strength. On the other hand, if the average molecular weight of the oligomer exceeds over 500,000, it would become difficult to obtain a resist pattern exhibiting an excellent resolution. On the other hand, when aforementioned oligomer is to be employed as an optical material, the average molecular weight of the oligomer should preferably be set to the range of from 1,000 to 500,000. If the average molecular weight of the oligomer is less than 1,000, it would become difficult to obtain a molded product having a sufficient mechanical strength. On the other hand, if the average molecular weight of the oligomer exceeds over 500,000, it may become difficult to perform the molding thereof.

Next, details on the photo-acid-generating agent to be incorporated into a photosensitive composition of this invention will be explained as follows. Namely, the photo-acid-generating agent may be selected from an arylonium salt, a naphthoquinone diazide compound, a diazonium salt, sulfonate compound, a sulfonium compound, a sulfonamide compound, an iodonium compound and sulfonyl diazomethane.

Specific examples of these compounds are triphenylsulfonium triflate, diphenyliodonium triflate, 2,3,4,4',-tetrahydroxybenzophenone-4-naphthoquinonediazide sulfonate, 4-N-phenylamino-2-methoxyphenyldiazonium sulfate, 4-N-phenylamino-2-methoxyphenyldiazonium p-ethylphenyl sulfate, 4-N-phenylamino-2-methoxyphenyldiazonium 2-naphthyl sulfate, 4-N-phenylamino-2-methoxyphenyldiazonium phenyl sulfate, 2,5-diethoxy-4-N-4'-methoxyphenylcarbonylphenyl diazonium 3-carboxy-4-hydroxyphenyl sulfate, 2-methoxy-4-N-phenylphenyldiazonium 3-carboxy-4-hydroxyphenyl sulfate, diphenylsulfonylmethane, diphenylsulfonyldiazomethane, diphenyldisulfone, α-methylbenzoin tosylate, pyrogallol trimecylate, benzoin tosylate, MPI-103 (CAS. No. [87709-41-9], Midori Kagaku Co., Ltd.), BDS-105 (CAS. No. [145612-66-4], Midori Kagaku Co., Ltd.), NDS-103 (CAS. No. [110098-97-0], Midori Kagaku Co., Ltd.), MDS-203 (CAS. No. [127855-15-5], Midori Kagaku Co., Ltd.), Pyrogallol tritosylate (CAS. No. [20032-64-8], Midori Kagaku Co., Ltd.), DTS-102 (CAS. No. [75482-18-7], Midori Kagaku Co., Ltd.), DTS-103 (CAS. No. [71449-78-0], Midori Kagaku Co., Ltd.), MDS-103 (CAS. No. [127279-74-7], Midori Kagaku Co., Ltd.), MDS-105 (CAS. No. [116808-67-4], Midori Kagaku Co., Ltd.), MDS-205 (CAS. No. [81416-37-7], Midori Kagaku Co., Ltd.), BMS-105 (CAS. No. [149934-68-9], Midori Kagaku Co., Ltd.), TMS-105 (CAS. No. [127820-38-6], Midori Kagaku Co., Ltd.), DNB-101 (CAS. No. [20444-09-1], Midori Kagaku Co., Ltd.), NB-201 (CAS. No. [4450-68-4], Midori Kagaku Co., Ltd.), NB-101 (CAS. No. [114719-51-6], Midori Kagaku Co., Ltd.), DNB-102 (CAS. No. [131509-55-2], Midori Kagaku Co., Ltd.), DNB-103 (CAS. No. [132898-35-2], Midori Kagaku Co., Ltd.), DNB-104 (CAS. No. [132898-36-3], Midori Kagaku Co., Ltd.), DNB-105 (CAS. No. [132898-37-4], Midori Kagaku Co., Ltd.), DAM-101 (CAS. No. [1886-74-4], Midori Kagaku Co., Ltd.), DAM-102 (CAS. No. [28343-24-0], Midori Kagaku Co., Ltd.), DAM-103 (CAS. No. [14159-45-6], Midori Kagaku Co., Ltd.), DAM-104 (CAS. No. [130290-80-1], CAS. No. [130290-82-3], Midori Kagaku Co., Ltd.), DAM-201 (CAS. No. [28322-50-1], Midori Kagaku Co., Ltd.), CMS-105, DAM-301 (CAS. No. [138529-81-4], Midori Kagaku Co., Ltd.), SI-105 (CAS. No. [34694-40-7], Midori Kagaku Co., Ltd.), NDI-105 (CAS. No. [133710-62-0], Midori Kaga Co., Ltd.), and EPI-105 (CAS. No. [135133-12-9], Midori Kagaku Co., Ltd.). It is also possible to employ the following compounds.

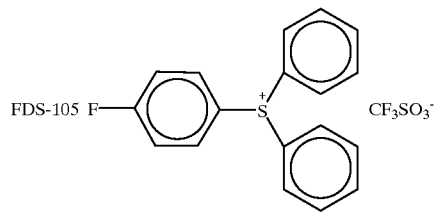

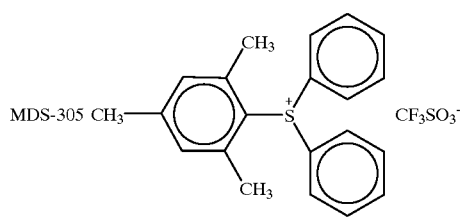

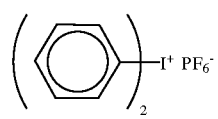

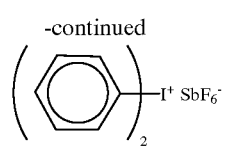

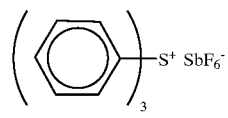

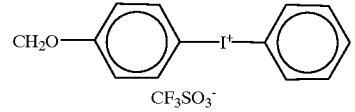

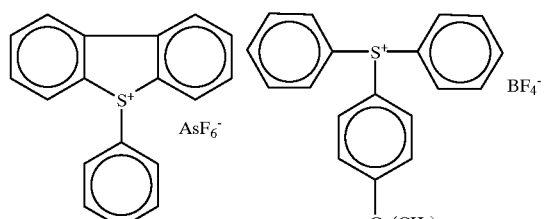

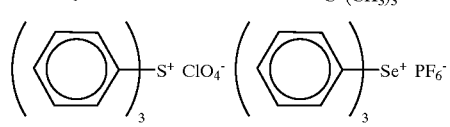

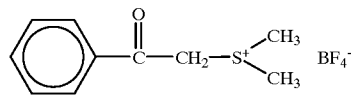

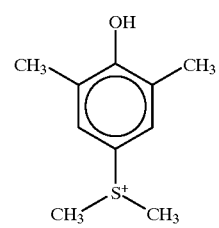

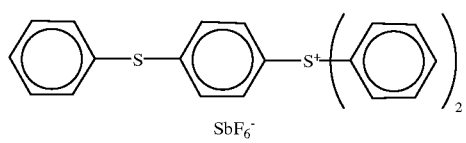

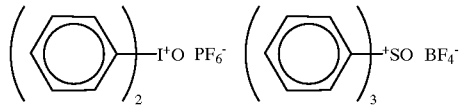

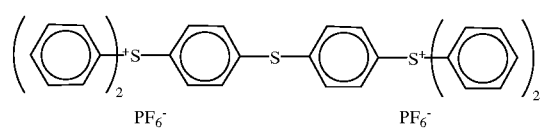

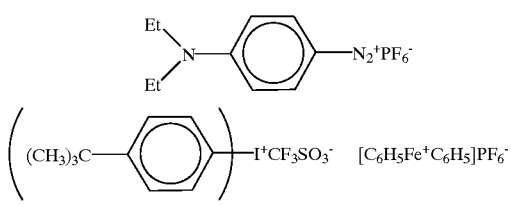

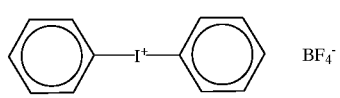

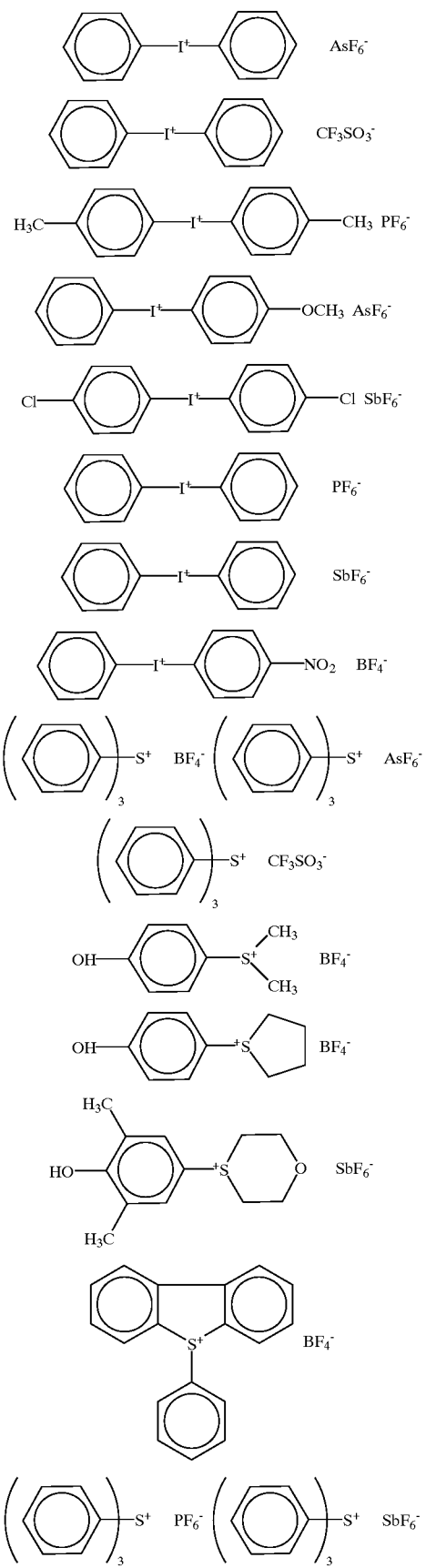
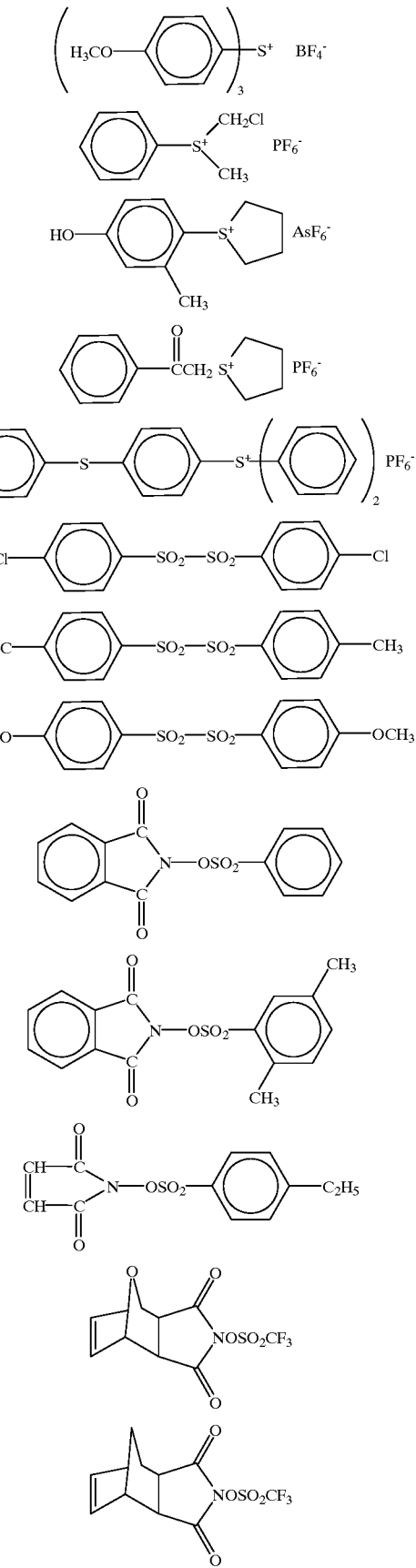

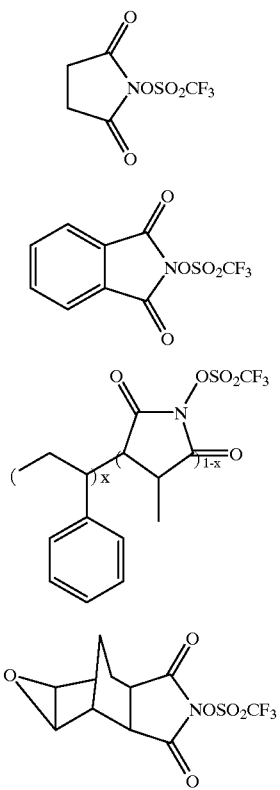

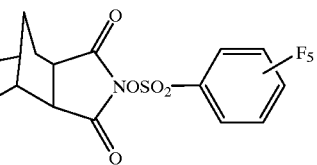

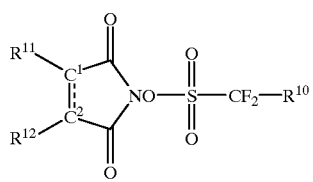

wherein $C^1$ and $C^2$ may be forming a single bond or a double bond; $R^{10}$ is hydrogen atom, fluorine atom, alkyl group or aryl group both of which may be partially substituted by fluorine atom; $R^{11}$ and $R^{12}$ may be the same or different and are individually a monovalent organic group; and $R^{11}$ and $R^{12}$ may be connected together to form a cyclic structure.

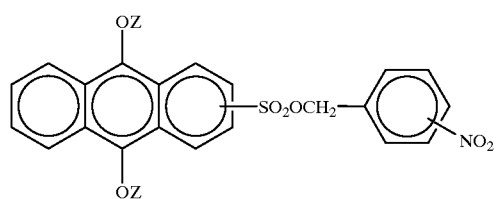

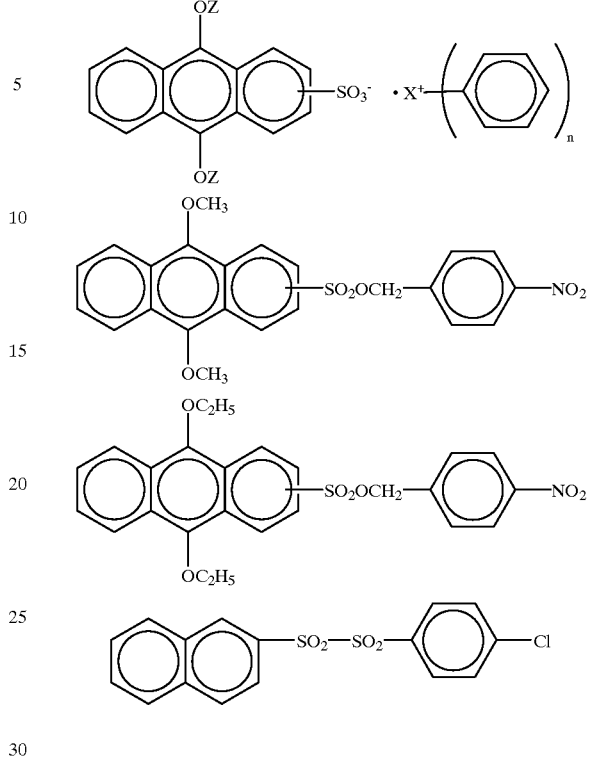

wherein Z represents an alkyl group.

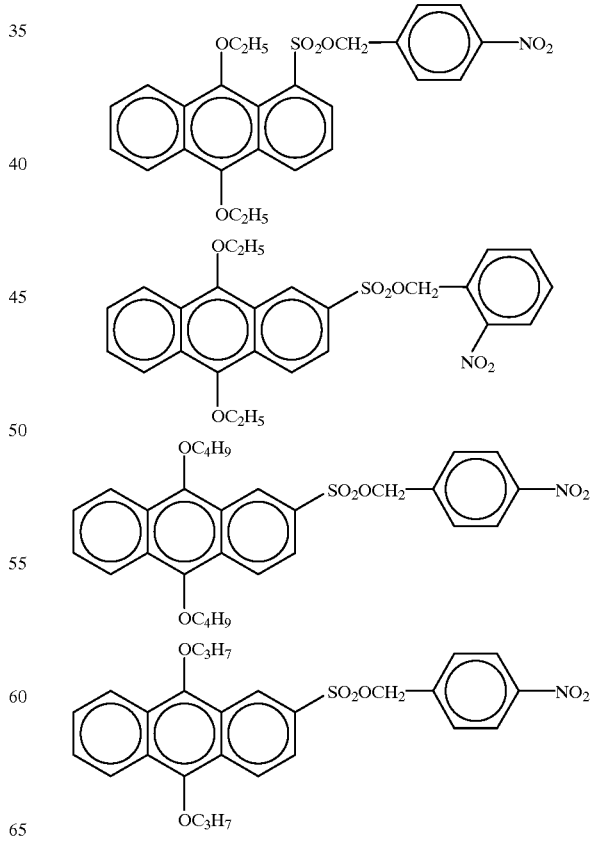

-continued

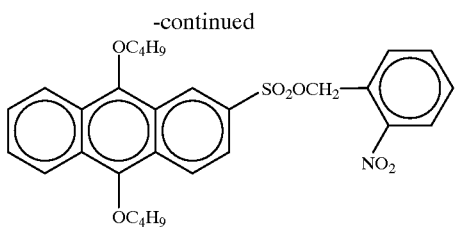

Conjugated polycyclic aromatic compounds having a naphthalene skeleton or dibenzothiophene skeleton, such as an arylonium salt, sulfonate compound, a sulfonyl compound or a sulfonamide compound are more advantageous in view of its excellent transparency to a light of short wavelength and heat resistance.

Specific examples of such compounds are sulfonyl or sulfonate compounds having hydroxyl group attached to a cyclic group such as naphthalene ring, pentalene ring, indene ring, azulene ring, heptalene ring, biphenylene ring, as-indacene ring, s-indacene ring, acenaphthylene ring, fluorene ring, phenalene ring, phenanthrene ring, anthracene ring, fluoranthene ring, acephenanthrylene ring, aceanthrylene ring, triphenylene ring, pyrene ring, chrysene ring, naphtacene ring, pleiadene ring, picene ring, perylene ring, pentaphene ring, pentacene ring, tetraphenylene ring, hexaphene ring, hexacene ring, rubicene ring, coronene ring, trinaphthylene ring, heptaphene ring, heptacene ring, pyranthrene ring, ovalene ring, dibenzophenanthrene ring, benz[a]anthracene ring, dibenzo[a,j]anthracene ring, indeno[1,2-a]indene ring, anthra[2,1-a]naphthacene or 1H-benzo[a]cyclopent[j]anthracene ring; 4-quinone diazide compounds having a cyclic group such as naphthalene ring, pentalene ring, indene ring, azulene ring, heptalene ring, biphenylene ring, as-indacene ring, s-indacene ring, acenaphthylene ring, fluolene ring, phenalene ring, phenanthrene ring, anthracene ring, fluoranthene ring, acephenanthrylene ring, aceanthrylene ring, triphenylene ring, pyrene ring, chrysene ring, naphtacene ring, pleiadene ring, picene ring, perylene ring, pentaphene ring, pentacene ring, tetraphenylene ring, hexaphene ring, hexacene ring, rubicene ring, coronene ring, trinaphthylene ring, heptaphene ring, heptacene ring, pyranthrene ring, ovalene ring, dibenzophenanthrene ring, benz[a]anthracene ring, dibenzo[a,j]anthracene ring, indeno[1,2-a]indene ring, anthra[2,1-a]naphthacene or 1H-benzo[a]cyclopent[j]anthracene ring; and a salt derived from the reaction between a triflate and sulfonium or iodonium having, as a side chain, naphthalene ring, pentalene ring, indene ring, azulene ring, heptalene ring, biphenylene ring, as-indacene ring, s-indacene ring, acenaphthylene ring, fluolene ring, phenalene ring, phenanthrene ring, anthracene ring, fluoranthene ring, acephenanthrylene ring, aceanthrylene ring, triphenylene ring, pyrene ring, chrysene ring, naphtacene ring, pleiadene ring, picene ring, perylene ring, pentaphene ring, pentacene ring, tetraphenylene ring, hexaphene ring, hexacene ring, rubicene ring, coronene ring, trinaphthylene ring, heptaphene ring, heptacene ring, pyranthrene ring, ovalene ring, dibenzophenanthrene ring, benz[a]anthracene ring, dibenzo[a,j]anthracene ring, indeno[1,2-a]indene ring, anthra[2,1-a]naphthacene or 1H-benzo[a]cyclopent[j]anthracene ring.

Among these conjugated polycyclic aromatic compounds, a sulfonyl sulfonamide compound or sulfonate compound having a naphthalene or anthracene ring; 4-quinone diazide compounds having a hydroxyl group-substituted naphthalene or anthracene ring; and a salt derived from the reaction between a triflate and sulfonium or iodonium having, as a side chain, a naphthalene or anthracene ring are preferable in particular.

More preferable examples of the photo-acid-generating agent to be employed in this invention are triphenylsulfonium triflate, diphenyliodonium triflate, trinaphthylsulfonium triflate, dinaphthyliodonium triflate, dinaphthylsulfonyl methane, NAT-105 (CAS. No. [137867-61-9], Midori Kagaku Co., Ltd.), NAT-103 (CAS. No. [131582-00-8], Midori Kagaku Co., Ltd.), NAI-105 (CAS. No. [85342-62-7], Midori Kagaku Co., Ltd.), TAZ-106 (CAS. No. [69432-40-2], Midori Kagaku Co., Ltd.), NDS-105 (Midori Kagaku Co., Ltd.), PI-105 (CAS. No. [41580-58-9], Midori Kagaku Co., Ltd.), s-alkylated dibenzothiophene triflate and s-fluoroalkylated dibenzothiophene triflate (Daikin Co., Ltd.). Among these photo-acid-generating agents, most preferable examples are triphenylsulfonium triflate, trinaphthylsulfonium triflate, dinaphthyliodonium triflate, dinaphthylsulfonyl methane, NAT-105 (CAS.

No. [137867-61-9], Midori Kagaku Co., Ltd.), NDI-105 (CAS. No. [133710-62-0], Midori Kagaku Co., Ltd.) and NAI-105 (CAS. No. [85342-62-7], Midori Kagaku Co., Ltd.).

The content of the photo-acid-generating agent in a photosensitive composition of this invention should preferably be in the range of from 0.001 mol. % to 50 mol. %, more preferably 0.01 mol. % to 40 mol. %, most preferably 0.1 mol. % to 20 mol. % based on other entire solid matters. Because if the content of this acid-generating agent is less than 0.001 mol. %, it would be difficult to form a resist pattern in high sensitivity. On the other hand, if the content of this acid-generating agent is more than 50 mol. %, the mechanical strength of a resist film to be obtained would be undesirably lowered.

In addition to the aforementioned components, a photosensitive composition of this invention may contain, for the purpose of improving the coating property or sensitivity thereof, another kind of alkali-soluble resin or a resin compound which is capable of increasing the solubility of the composition to an alkaline solution when the composition is subjected to an exposure of radiation.

The alkali-soluble resin to be employed in this case are a homopolymer or copolymer of vinyl compound as exemplified as follows. Namely, examples of such a vinyl compound are methyl acrylate, methyl methacrylate, α-chloroacrylate, cyanoacrylate, trifuluoromethyl acrylate, a-methyl styrene, trimethylsilyl methacrylate, trimethylsilyl a-chloroacrylate, trimethylsilylmethyl α-chloroacrylate, maleic anhydride, tetrahydropyranyl methacrylate, tetrahydropyranyl α-chloroacrylate, t-butyl methacrylate, t-butyl α-chloroacrylate, butadiene, glycidyl methacrylate, isobornyl methacrylate, menthyl methacrylate, norbornyl methacrylate, adamantyl methacrylate and allyl methacrylate.

The average molecular weight of the aforementioned alkali-soluble resin should preferably be set to the range of from 1,000 to 20,000. If the average molecular weight of the alkali-soluble resin is less than 1,000, it would become difficult to obtain a composition having a suitable coating property or to form a resist film having a sufficient mechanical strength. On the other hand, if the average molecular weight of the soluble resin exceeds over 20,000, the alkali-developing property of the composition would be deteriorated, thus making it difficult to obtain a resist pattern exhibiting an excellent resolution.

If the aforementioned alkali-soluble resin is to be incorporated in a photosensitive composition of this invention, the content of the alkali-soluble resin should preferably be set to the range of from 10 wt % to 60 wt % based on the composition in general. If the content of the alkali-soluble resin is less than 10 wt %, the coating property of the photosensitive composition may be deteriorated. On the other hand, if the content of the alkali-soluble resin exceeds over 60 wt %, it would become difficult to provide the photosensitive composition with a sufficient sensitivity.

Although it is possible according to the photosensitive composition of this invention to form a resist through an acid decomposition of the photosensitive composition without requiring any additives, it may contain a solubility-inhibiting agent, i.e. a compound containing an acid-decomposable group having a solubility-inhibiting property to an alkaline solution, since the photosensitive composition of this invention is highly sensitive to an alkaline solution. As for the solubility-inhibiting agent to be employed in this invention, a compound having an acid-decomposable group which exhibits a sufficient solubility-inhibiting property to an alkaline solution and is capable of generating radicals such as —(C=O)OH, —OS(=O)$_2$OH, or —OH in an alkali solution upon being decomposed by an acid may be employed.

For example, this compound can be obtained by introducing an acid-decomposable group into a low molecular aromatic compound such as bisphenol A, bisphenol F, tri(hydroxyphenyl) methane, phenolphthalein, cresolphthalein, thymolphthalein, catechol, pyrogallol, naphthol, bisnaphthol A, bisnaphthol F and benzoic acid derivatives; or into a low molecular aliphatic alcohol such as cholate, steroids, terpenoid derivatives and saccharides.

Specific examples of such a compound are those that can be derived by modifying phenolic compounds into t-butoxycarbonyl ether, tetrahydropyranyl ether, 3-bromotetrahydropyranyl ether, 1-methoxycyclohexyl ether, 4-methoxytetrahydropyranyl ether, 1,4-dioxan-2-yl ether, tetrahydrofuranyl ether, 2,3,3a,4,5,6,7,7α-octahydro-7,8,8-trimethyl-4,7-methanobenzofuran-2-yl ether, t-butyl ether, trimethylsilyl ether, triethylsilyl ether, triisopropylsilyl ether, dimethylisopropylsilyl ether, diethylisopropylsilyl ether, dimethylcexylsilyl ether and t-butyldimethylsilyl ether. It is also possible to employ as a solubility-inhibiting agent merdramic acid derivatives. Among these compounds, preferable examples are those which can be derived by protecting the hydroxyl group of a phenolic compound with t-butoxycarbonyl group, t-butoxycarbonylmethyl group, trimethylsilyl group, t-butyldimethylsilyl group or tetrahydropyranyl group; a compound which can be obtained by attaching merdramic acid to naphthaldehyde; and a compound which can be obtained by attaching merdramic acid to a carbonyl compound having an alicyclic structure.

The solubility-inhibiting agent according to this invention may be esters of polycarboxylic acid, which include isopropyl ester, tetrahydropyranyl ester, tetrahydrofuranyl ester, methoxyethoxymethyl ester, 2-trimethylsilylethoxymethyl ester, t-butyl ester, trimethylsilyl ester, triethylsilyl ester, t-butyldimethylsilyl ester, isopropyldimethylsilyl ester, di-t-butyldimethylsilyl ester, oxazole, 2-alkyl-1,3-oxazoline, 4-alkyl-5-oxo-1,3-oxazoline or 5-alkyl-4-oxo-1,3-dioxsolane. It is also possible to employ the following compounds.

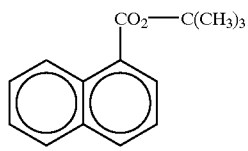

-continued

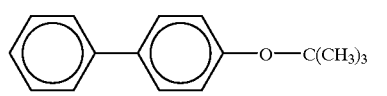

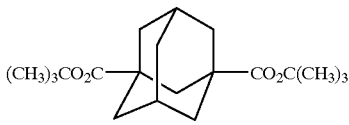

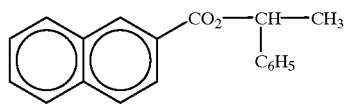

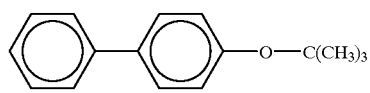

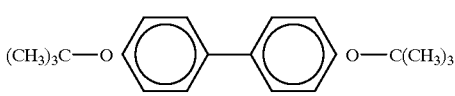

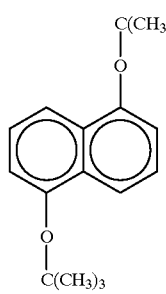

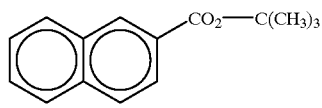

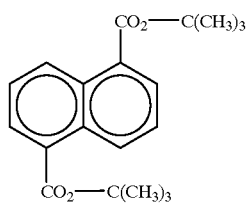

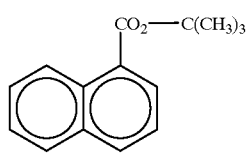

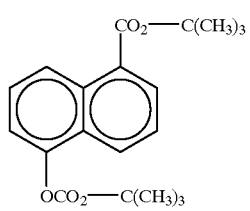

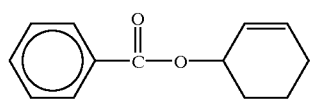

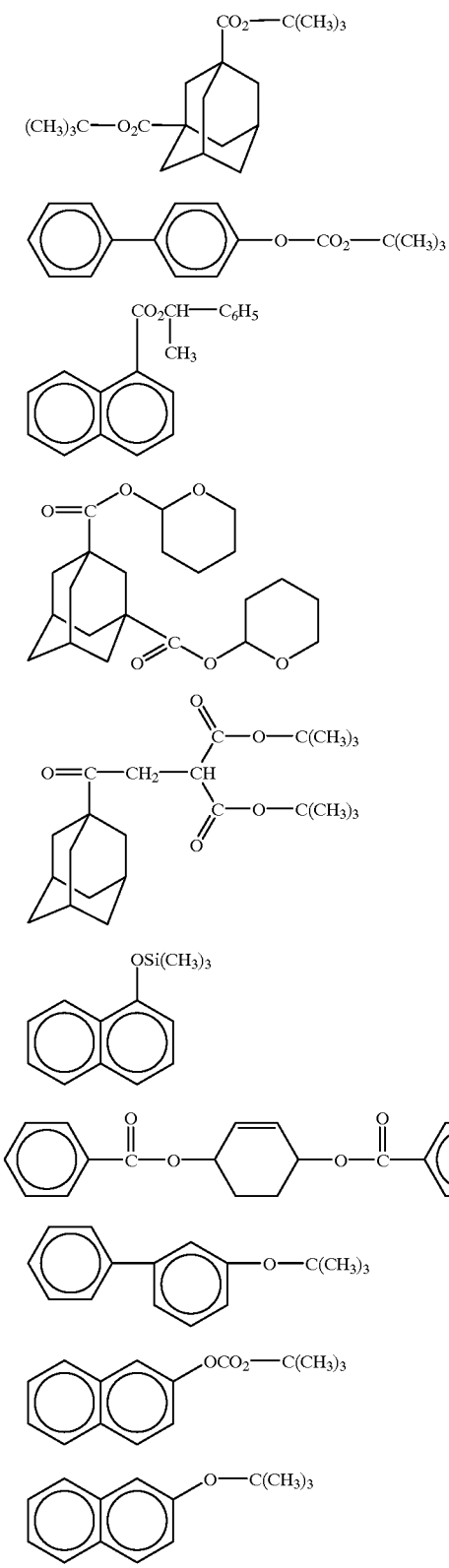
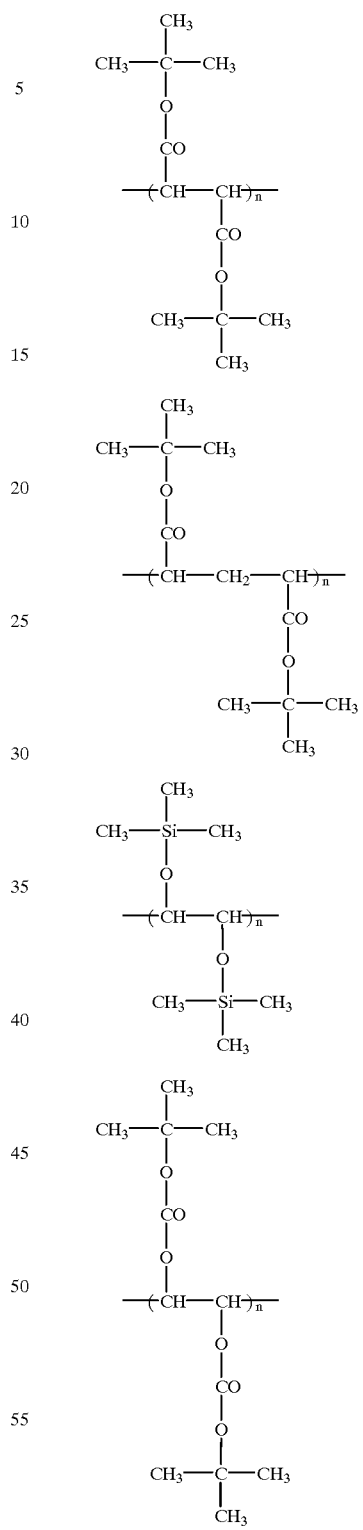

-continued

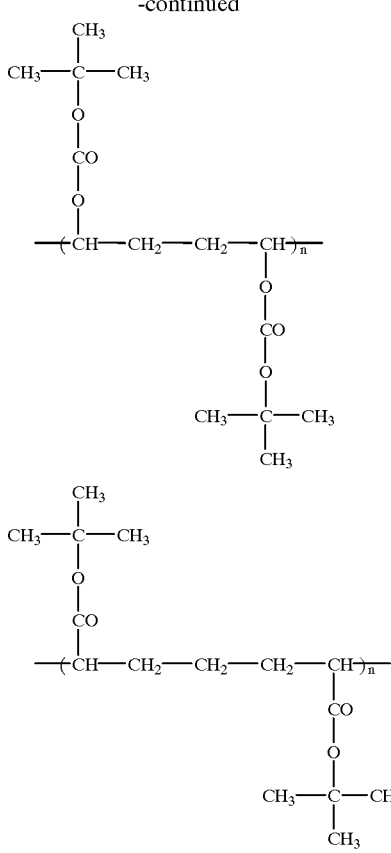

Among these solubility-inhibiting agents, a conjugated polycyclic aromatic compound is more preferable in this invention in view of its excellent transparency to a light of short wavelength. Namely, in this conjugated polycyclic aromatic compound, the light absorption zone thereof is shifted to a lower wavelength side due to the conjugate stabilization of π electron, so that, with the employment of this conjugated polycyclic aromatic compound as a solubility-inhibiting agent in this invention, it is possible to obtain a photosensitive composition which is excellent in heat resistance and in transparency to a light of short wavelength.

The mixing ratio of the dissolution-inhibiting agent in the photosensitive composition of this invention is preferably 3 to 60%, more preferably 10 to 30% based on the weight of the base resin. If the mixing ratio of the dissolution-inhibiting agent is less than 3%, it would be difficult to obtain a resist pattern excellent in resolution. On the other hand, if the mixing ratio of the dissolution-inhibiting agent exceeds over 60%, the mechanical strength of the resultant resist film may be deteriorated and at the same time the dissolution rate at the occasion of removing the light-exposed portion of resist by way of the dissolution with an alkaline solution may be extremely lowered.

When an oligomer containing an acid anhydride structure is incorporated into the photosensitive composition of this invention, the composition would be crosslinked by a dosage of radiation, so that an image of negative type can be formed. Alternatively, since a photo-acid-generating agent is included in the photosensitive composition of this invention as in the case of employing an oligomer of polyvalent hydroxycholane derivative, a dehydrating condensation may take place in the composition as it is subjected to an exposure/heating treatment, whereby obtaining a negative type resist. When both carboxylic acid and hydroxyl group are included in the resin composition, a negative type image can be obtained depending on the conditions of heating treatment.

It is possible to positively utilize the aforementioned feature of the resin composition whereby to form a resist of negative type. Namely, a compound having an alicyclic skeleton containing carboxyl group and hydroxyl group, or a compound having a conjugated polycyclic condensed aromatic skeleton containing carboxyl group and hydroxyl group can be employed. Specific examples of such a compound are glycolic acid, lactic acid, hydroxybutyric acid, hydroxymethyl propanic acid, hydroxypentanecarboxylic acid, glyceric acid, tartronic acid, malic acid, tartaric acid, racemic acid, glycol citrate, 2-hydroxybutyric acid, 2-hydroxy-2-methylpropanic acid, 2-hydroxy-4-methylpentanic acid, 3-hydroxy-3-pentanecarboxylic acid, hydroacrylic acid, 10-hydroxyoctadecanic acid, ricinoleic acid, ricinelaidinic acid, β,β,β-trichlorolactic acid, ethylglycerate, 8,9-dihydroxyoctadecanic acid, diethylmalate, citramalic acid, β-hydroxygultalic acid, ethyl hydrogen d-tartarate, tetrahydroxy succinic acid, citric acid and desoxalic acid.

It is also possible to employ a compound having an alicyclic skeleton such as 2-hydroxy-1-cyclohexane carboxylic acid and 1-quinic acid; a compound having a steroid skeleton such as cholic acid, α-hyodeoxycholic acid, deoxycholic acid and lithocholic acid; or a compound having a condensed polycyclic skeleton such as 4-hydoxy-1-naphthoic acid. A condensation polymer of these compounds may also be employed.

It is preferable in view of improving heat resistance to manufacture the ester compound constituting a base polymer of the photosensitive composition of this invention by the condensation of a compound having a steroid skeleton containing both hydroxyl group and carboxyl group, such as cholic acid, α-hyodeoxycholic acid, deoxycholic acid and lithocholic acid. Namely, it is preferable to employ a photosensitive composition wherein the compound having an alicyclic skeleton containing carboxyl group and hydroxyl group is formed of a compound or ester oligomer having a steroid skeleton containing both hydroxyl group and carboxyl group.

For the purpose of enhancing the solubility of the aforementioned polymer, an acid anhydride or carboxylic anhydride derivative represented by the following general formula (10) may be esterified thereby to increase the quantity of carboxylic acid in the polymer.

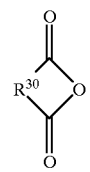

(10)

wherein $R^{30}$ may be any kind of atom or molecule, and the cyclic —(CO)O(CO)— may contain a plural number of $R^{30}$.

Specific examples of the acid anhydride represented by the following general formula (10) are succinic anhydride, maleic anhydride, citraconic anhydride, 1,2-cyclohexane dicarboxylic anhydride, camphoronic anhydride, phthalic anhydride, pyromellitic anhydride, mellitic anhydride, chlorophthalic anhydride, dichlorophthalic anhydride, tetrachlorophthalic anhydride, 3-nitrophthalic anhydride and an hydrogenated product of these compounds. These acid anhydrides may be bonded with a compound represented by the general formula (5) by making use of a condensation agent. These acid anhydrides may be reacted in advance with a compound having an alicyclic skeleton containing both hydroxyl group and carboxyl group, such as cholic acid, α-hyodeoxycholic acid, deoxycholic acid and lithocholic acid, and then condensed to form an oligomer.

The resultant oligomer is then mixed with a photo-acid-generating agent thereby to obtain a photosensitive composition of this invention.

When the oligomer contains a sufficient quantity of hydroxyl group and carboxyl group, a dehydrating condensation reaction would take place by making use of acid generated by a baking after exposure (PEB) as a catalyst, thereby causing a crosslinking reaction to take place at the light exposure portions. In the case of a photosensitive composition containing an oligomer represented by the general formula (9), this feature can be taken advantage of, thereby obtaining a negative type resist. In this case, since the dehydrating condensation reaction is required to be taken place more vigorously than the hydrolysis of ester, the PEB (post-exposure baking) temperature should preferably be 100° C. or more, more preferably 150° C. or more. As for the photo-acid-generating agent to be employed in this case, it should preferably be selected from those having a sufficient heat resistance to withstand the PEB temperature.

On the other hand, when hydroxyl group is found not so many in the polymer, the aforementioned crosslinking reaction would hardly be taken place, rendering it impossible to obtain a resist of negative type. Namely, in this case, the hydrolysis of ester takes place more vigorously than the dehydrating condensation reaction, thus obtaining a resist of positive type.

The photosensitive composition of this invention may contain a crosslinking agent or additive for the purpose of assisting the reaction for forming a negative or positive resist. The addition of a crosslinking agent is preferable in the case of forming a negative resist in particular in view of enhancing the sensitivity of the photosensitive composition.

As for the crosslinking agent useful in this case, a melamine resin represented by the cymel series (Mitsui-Cyanamid Ltd.) is suited for use. Alternatively, an epoxy resin, diepoxide compound, a diisocyanate compound, a bisazide compound or a compound having a radical double bond may also be employed.

An ester oligomer having a hydroxycholane skeleton or poly(isocyanate) having a hydroxycholane skeleton, as well as an ester or amide oligomer represented by the following general formula (11) are relatively high in softening point, e.g. 200° C. or more, so that they are suited for use as a transparent resin having heat resistance.

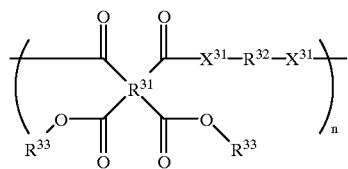

(11)

wherein $X^{31}$ is NH or O; $R^{31}$ is a tetra-valent organic group having an alicyclic skeleton or a conjugated polycondensed aromatic skeleton; $R^{32}$ is a bi-valent organic group having an alicyclic skeleton or a conjugated polycondensed aromatic skeleton; $R^{33}$ is hydrogen atom or mono-valent organic group; and n is an integer.

Since these materials are transparent, they are suited for use as an optical material or as a coating material. Additionally, these materials are thermally curable and biodecomposable since they are natural polymer and hence unharmful to the environment.

The oligomer represented by the general formula (11) can be manufactured in the same manner as explained with reference to the oligomer represented by the general formula (9) except that a diamine compound having an alicyclic skeleton is substituted for the dihydroxy compound having an alicyclic skeleton. Specific examples of a diamine compound having an alicyclic skeleton are 1,4-diaminocyclohexane, 4,4'-diaminodicyclohexylmethane, 3,3'-dimethyl-4,4'-diaminodicyclohexylmethane, tetrahydrodicyclopentadienylene diamine, and tricyclo(6,2,1,02,7)-undecylenediethyl diamine.

Although it is possible in the case where the aforementioned curing resin is polyamic acid to thermally cure the resin, a photo-acid-generating agent may be employed as a catalyst so as to perform the thermal crosslinking of the resin. As for the photo-acid-generating agent to be employed in this case, the same materials as mentioned above can be employed.

It is possible to improve the stability of the photosensitive composition of this invention by incorporating therein a basic compound such as nitrogen-containing basic compound.

Specific examples of such a nitrogen-containing basic compound are methyl amine, dimethyl amine, trimethyl amine, ethyl amine, diethyl amine, triethyl amine, n-propyl amine, di-n-propyl amine, tri-n-propyl amine, isopropyl amine, n-butyl amine, sec-butyl amine, tert-butyl amine, cyclohexyl amine, di-n-butyl amine, tri-n-butyl amine, benzyl amine, α-phenylethyl amine, β-phenylethyl amine, ethylene diamine, tetramethylene diamine, hexamethylene diamine, aniline, methyl aniline, dimethyl aniline, N-methyl aniline, N,N-dimethyl aniline, diphenyl amine, triphenyl amine, o-toluidine, m-toluidine, o-anisidine, m-anisidine, p-anisidine, o-chloroaniline, m-chloroaniline, p-chloroaniline, o-bromoaniline, m-bromoaniline, p-bromoaniline, o-nitroaniline, m-nitroaniline, p-nitroaniline, 2,4-dinitroaniline, 2,4,6-trinitroaniline, o-phenylene diamine, benzidine, p-aminobenzoic acid, sulfanilic acid, sulfanyl amide, pyridine, benzylpyridine, trimethylpyridine, 4-dimethylaminopyridine, 4-phenylpyridine, 3-phenylpyridine, 2-phenylpyridine, piperidine, piperazine, urea, quinoline, methylquinoline, methoxyquinoline, isoquinoline, pyrazole, pyrazolone, imidazole, methylimidazole, triphenylimidazole, benzoimidazole, nicotinamide, 2-benzotriazole, pyridazine, pyrimidine, triazole, nitron, benzotriazole, purine, oxazole, indole, indazole, diaminodiphenylsulfone, 1,3-bis(γ-aminopropyl)-1,1,3,3-tetramethyl siloxane and pyridinium salts.

Among these nitrogen-containing compounds, pyridine compounds are more preferable. Specific examples of pyridine compounds are following three kinds.

(1) A pyridine compound having at least one substituent group consisting of an organic group composed of carbon and hydrogen atoms, or consisting of alkoxyl group.

(2) A pyridine compound where 2 or more of substituted or unsubstituted pyridine rings are directly linked or indirectly linked via a bi-valent organic group composed of carbon and hydrogen atoms.

(3) A polymer having on its side chain a pyridine ring.

Followings are explanations on these three kinds of pyridine compounds.

Examples of an organic group composed of carbon and hydrogen atoms in the pyridine compound of the aforementioned item (1) are methyl group, ethyl group, propyl group, butyl group, pentyl group, hexyl group, heptyl group, octyl group, nonyl group, decyl group, undecyl group, dodecyl group, isopropyl group, isobutyl group, sec-butyl group, isopentyl group, isohexyl group, 1-ethylpropyl group, 1-propylbutyl group, 1-butylpentyl group, 1-pentylheptyl group, 1-heptyloctyl group, tert-butyl group, neopentyl group, tert-pentyl group, cyclopropyl group, cyclobutyl group, cyclopentyl group, cyclohexyl group, vinyl group, isopropenyl group, 1-propenyl group, allyl group, 1-butenyl group, 2-butenyl group, 2-pentenyl group, 3-pentenyl group, styryl group, cinnamyl group, phenyl group, biphenyl group, naphthyl group, benzyl group, phenethyl group, tolyl group, xylyl group, and tolythyl group.

Examples of alkoxyl group are methoxy group, ethoxy group, propoxy group, isopropoxy group, butoxy group, isobutoxy group, sec-butoxy group, tert-butoxy group, pentyloxy group, isopentyloxy group, and hexyloxy group.

Examples of pyridine compound having the aforementioned organic group are 2-propyl pyridine, 4-isopropyl pyridine, 3-butyl pyridine, 5-ethyl-2-methyl pyridine, 5-butyl-2-methyl pyridine, 2,4,6-trimethyl pyridine, 2,4,6-triethyl pyridine, 2-phenyl pyridine, 3-phenyl pyridine, 4-phenyl pyridine, 3-methyl-2-phenyl pyridine, 4-tert-butyl pyridine, 2,6-di-tert-butyl pyridine, 2-(p-tolyl) pyridine, 2,6-diphenyl pyridine, 2,6-di-p-tolyl pyridine, 4-(1-butylpentyl) pyridine, 2-benzyl pyridine, 2-(3-pentenyl) pyridine, 2-methoxy pyridine, 2-butoxy pyridine, 2,6-butoxy pyridine, and 2,6-dimethoxy pyridine.

Examples of bi-valent organic group composed of carbon and hydrogen atoms, which constitutes a linking group of the pyridine compound of the item (2) are methylene group, ethylene group, trimethylene group, tetramethylene group, propylene group, propenylene group, hexamethylene group, pentamethylene group, vinylene group and 2-butenylene group.

Examples of the pyridine compound having the aforementioned structure of the item (2) are 2,2'-dipyridyl, 2,4'-dipyridyl, 4,4'-dipyridyl, 2,2',6,6'-terpyridine, 4,4'-dimethyl-2,2'-dipyridyl, 4,4'-diphenyl-2,2'-dipyridyl, 1,2-bis(4-pyridyl) ethane, and 1,2-bis(2-pyridyl) ethylene.

Examples of the polymer or copolymer having a pyridine ring on its side chain and constituting a pyridine compound of the aforementioned item (3) are poly(2-vinyl pyridine), poly(3-vinyl pyridine), poly(4-vinyl pyridine), poly(2-vinyl-4-methyl pyridine), poly(4-vinyl-3,5-dimethyl pyridine), 2-vinyl pyridine-styrene copolymer, 4-vinyl pyridine-styrene copolymer, 4-vinyl pyridine-methacrylic acid copolymer, 2-vinyl pyridine-acrylic acid copolymer, 4-methyl pyridine-butyl methacrylate copolymer, and 4-vinyl pyridine-divinylbenzene copolymer.

These polymers or copolymers having a pyridine ring on its side chain can be synthesized by a known method such as set forth in a publication; "Shin Jikken Kagaku Koza Vol. 19, High-Polymer Chemistry [1], pp. 279 (1978)", Nihon Kagaku kai.

The mixing ratio of the aforementioned nitrogen-containing basic compound should preferably be within the range of from 2 mol. % to 60 mol. %, more preferably 5 mol. % to 50 mol. % based on the number of mole of the acid-generating agent to be added.

The photosensitive composition of this invention is usually supplied in the form of a varnish by a manufacturing method wherein the aforementioned oligomer and photo-acid-generating agent are dissolved in an organic solvent together with, if required, an alkali-soluble resin, a solubility-inhibiting agent and a crosslinking agent thereby to form a mixture, which is then subjected to filtration. The photosensitive composition of this invention may contain, in addition to the aforementioned components, other kinds of polymer such as epoxy resin, polymethacrylate, polymethylacrylate, polymethylmethacrylate, propylene oxide-ethylene oxide copolymer or polystyrene; a basic compound such as an amine compound and a pyridine derivative for improving environmental resistance; a surfactant for modifying the quality of coated film; and a dye functioning as an anti-reflection agent.

When a basic compound is added to a chemical amplification type resist composition in particular, the property of the resist can be effectively improved. For example, Japanese Patent Unexamined Publication S/63-149640 describes that changes in sensitivity after exposure was suppressed by the addition of an amine compound in a chemical amplification type resist. Further, Japanese Patent Unxamined Publication H/5-127369 describes that the resolution of resist was enhanced by the addition of a derivative of various kinds which functions as a base for an acid to be generated upon irradiation, such as aniline based, imidazole based, pyridine based and ammonia based derivatives.

The organic solvents useful in this case are a ketone type solvent such as cyclohexanone, acetone, methyl ethyl ketone and methylisobutyl ketone; a cellosolve type solvent such as methylcellosolve, methylcellosolve acetate, ethylcellosolve acetate and butylcellosolve acetate; an ester type solvent such as ethyl acetate, butyl acetate, isoamyl acetate and γ-butyrolactone; a glycol type solvent such as propyleneglycol monomethylether acetate; a nitrogen-containing solvent such as dimethylsulfoxide, hexamethylphosphorictriamide, dimethylformamide and N-methylpyrrolidone; and a mixed solvent containing dimethylsulfoxide, dimethylformaldehyde or N-methylpyrrolidone in addition to any of the aforementioned solvents for the purpose of improving the solubility thereof. It is also possible to employ propionic acid derivatives such as methyl methylpropionate; lactates such as ethyl lactate; and PGMEA (propyleneglycol monoethyl acetate), since these solvents are low in toxicity. These solvents may be employed singly or in combination. These solvents may contain also a suitable amount of aliphatic alcohol such as isopropyl alcohol, ethyl alcohol, methyl alcohol, butyl alcohol, n-butyl alcohol, s-butyl alcohol, t-butyl alcohol and isobutyl alcohol; or aromatic solvent such as xylene and toluene. However, when an oligomer to be employed in the photosensitive composition of this invention is of an acid anhydride skeleton type, a solvent which is free from hydroxyl group should preferably be employed since the hydroxyl group in a solvent is more likely to react with the oligomer thereby deteriorating the stability of the photosensitive composition.

Followings are a detailed explanation on the process of forming a pattern by making use of a chemical amplification type resist of positive type as a photosensitive composition of this invention.

The varnish of a resist material dissolved in an organic solvent as exemplified above is coated on the surface of a substrate by means of a spin-coating method or a dipping method. Then, the coated layer is dried at a temperature of 150° C. or less, or preferably at a temperature of 70 to 120° C. thereby forming a resist film. The substrate to be employed in this case may be for example a silicon wafer;

a silicon wafer having an insulating film, electrodes or interconnecting wirings formed on the surface thereof; a blank mask; a Group III-V compounds (such as GaAs, AlGaAs) semiconductor wafer; a chrome- or chrome oxide-deposited mask; an aluminum-deposited substrate; an IBPSG-coated substrate; a PSG-coated substrate; an SOG-coated substrate; or a carbon film-sputtered substrate.

In this case, an anti-reflection film may be formed on the substrate prior to the coating of the photosensitive composition of this invention for the purpose of inhibiting any influence of reflected light from the substrate. It is possible to suppress the effect of the influence of reflected light from the substrate by an appropriate anti-reflection film formed on the resist film comprising the photosensitive composition of this invention.

Then, the resist film is irradiated through a predetermined mask with actinic radiation, or the actinic radiation is directly scanned over the surface of the resist film. Since the photosensitive composition according to this invention is excellent in transparency not only to a light of short wavelength but also to a light of wide range of wavelength, the actinic radiation to be employed in this exposure may be ultraviolet rays; X-rays; the i-line, h-line or g-line of low pressure mercury lamp light beam; a xenon lamp beam; a deep UV beam such as KrF or ArF excimer laser beam; a synchrotron orbital radiation beam (SOR); an electron beam (EB); γ-rays; and an ion beam.

The resist film thus exposed is then subjected to a baking step by heating it at a temperature of not higher than 170° C. using a hot plate or an oven, or by irradiating it with infrared rays. This baking treatment is especially preferable when the photosensitive composition of this invention is a chemical amplification type resist.

Subsequently, the resist film thus baked is subjected to a developing treatment by way of a dipping method or spraying method using an alkaline solution, thereby selectively removing the exposed portion or unexposed portion of the resist film to obtain a desired pattern. The alkaline solution useful as the developing solution may be an aqueous organic alkaline solution such as an aqueous solution of tetramethylammonium hydroxide and an aqueous solution of choline; an inorganic alkali solution such as an aqueous solution of potassium hydroxide or sodium hydroxide. These alkaline solutions may be further added with alcohol or a surfactant. The concentration of these alkaline solutions should preferably be 15 wt % or less in view of assuring a sufficient difference in dissolution rate between the exposed portion and the unexposed portion.

The resist pattern to be formed by making use of the photosensitive composition according to this invention is very excellent in resolution. For example, when a dry etching is performed with this resist pattern employed as an etching mask, an ultra-fine pattern having line width of the order of quarter micron can be accurately transferred onto an exposed surface of a substrate. In particular, when a resist pattern is formed by making use of a photosensitive composition containing an oligomer having a backbone of alicyclic structure, it is possible to assure a high dry-etching resistance, since even if one of carbon-carbon linkage is cut off in the alicyclic structure of the oligomer, other carbon-carbon linkage in the alicyclic structure would be kept remained.

The transcription of pattern to the substrate can be performed by means of a dry etching method or a wet etching method. In this case, if a fine working of 3 μm or less (in line width) is desired, a dry etching method may be preferably employed. In the case of wet etching method, the etching agent can be suitably selected depending on the material to be etched. For example, when a silicon oxide film is to be etched, an aqueous solution of phosphoric acid, hydrofluoric acid or nitric acid may be employed. When an chromium-based film is to be etched, an aqueous solution of ammonium cerium nitrate may be employed. In the case of dry etching method, $CF_4$, $C_2F_6$, $CCl_4$, $BCl_3$, $Cl_2$, HCl, etc. may be employed as a dry etching gas. These etching gases may be combined if required.

The conditions for the etching, i.e. the concentration of a wet etching agent in a reaction chamber, the concentration of a dry etching gas in a reaction chamber, reaction temperature and reaction time are determined depending on the combination of the kind of material on which a fine pattern is to be formed and the kind of a photosensitive polymer (resist) composition to be employed. The pattern formed with the photosensitive polymer composition and remaining on the substrate after an etching, or a flattening layer employed in a multilayer processing and remaining on the substrate after an etching may be removed by making use of a release agent (for example, J-100, Nagase Kasei Co., Ltd.) or an oxygen gas plasma.

Any additional steps may be included in the aforementioned process of forming a resist pattern.

For example, a flattening layer-forming step for forming an underlying layer for the resist film; a pretreatment step for improving the adhesion between the resist film and an underlying layer; a rinsing step for removing a developing solution with water for example after the development of the resist film; and a step of re-irradiating ultraviolet rays prior to a dry etching may be included.

This invention will be further explained in detail with reference to the following specific examples.

(Synthesis of monomer)

A dicarbonyl chloride compound was synthesized as follows.

0.1 mol of adamantane dicarboxylic acid (Aldrich reagent; Compound N) was dissolved in 200 ml of tetrahydrofuran (THF) and, after the addition of 0.3 mol of thionyl chloride, refluxed for 3 hours. After the generation of gas was stopped, unreacted thionyl chloride was distilled away and then the pressure was further reduced, thereby distilling the THF (solvent) and obtaining adamantane dicarbonyl chloride (Compound A).

Naphthalene dicarbonyl chloride (Compound B) was obtained by repeating the same process as described above except that naphthalene dicarboxylic acid was substituted for adamantane dicarboxylic acid.

As for trans-3,6-endomethylene-1,2,3,6-tetrahydrophthaloyl chloride (Compound C) was obtained by employing the Aldrich reagent as it was.

As for the hydroxy compound, the following compounds (Aldrich reagent) were employed.

(+)-cis-p-menthane-3,8 diol (Compound D)

Pinane diol (Compound E)

1,5-dihydroxynaphthalene (Compound M)

For the purpose of encapping the terminal of compound, the following compounds (Aldrich reagent) were employed.

2 methyl-2 adamantanol (Compound F)

1 adamantane carboxylic acid (Compound G)

Menthol (Compound H)

1-adamantane carbonyl chloride (Compound L)

5-(2-adamantylidene)-2,2-dimethyl-1,3-dioxane-4,6 dione (Compound O)

Hydrogenated pyromellitic acid anhydride (Compound P) was obtained from Kanto Koatsu Kagaku Co., Ltd.

As a compound containing both carboxylic acid and hydroxyl group, deoxycholic acid (Compound I, Aldrich reagent) and lithocholic acid (Compound J, Aldrich reagent) were employed. 1-adamantane carboxylic acid was oxidized by making use of an aqueous solution of potassium permanganate, and then mixed with an aqueous solution of sodium hydroxide to synthesized adamantane 1-carboxylic acid 3-ol (Compound K).

(Synthesis of oligomer)

The aforementioned monomers were employed to synthesize various oligomers which were respectively a component of the photosensitive composition of this invention.

0.05 mol of adamantane dicarbonyl chloride (Compound A) was dissolved in THF to prepare a solution, into which 0.05 mol of adamantane 1-carboxylic acid 3-ol (Compound K) was added. While the resultant mixed solution was kept at a temperature of 0° C. with stirring, a THF solution of 0.1 mol of triethyl amine was slowly dripped into the solution. The resultant solution was stirred for 2 hours, and then the stirring of the solution was continued for another 2 hours at room temperature. After the resultant reaction solution was subjected to filtration, the reaction solution was slowly dripped into water to obtain a precipitate, which was subsequently allowed to re-precipitate in a water-acetone-based solvent thereby to obtain an oligomer (1).

Likewise, oligomers (2) to (10) were synthesized by repeating the aforementioned procedures except that combinations of monomers as shown in the following Table 1 were employed in the synthesis.

10 g of deoxycholic acid (Compound I) was heated with stirring at a temperature of 200° C. for 15 minutes in an argon atmosphere to obtain an oligomer (11).

Moreover, 4.9 g of deoxycholic acid (Compound I) and 0.86 g of 5-(2-adamantylidene)-2,2-dimethyl-1,3-dioxane-4,6 dione (Compound O) were heated with stirring at a temperature of 200° C. in an argon atmosphere for 30 minutes while distilling components of low boiling point, thereby obtaining an oligomer (12).

3.25 g of hydrogenated pyromellitic acid anhydride (Compound P) was added to 4.9 g of deoxycholic acid and then heated with stirring at a temperature of 200° C. for 15 minutes in an argon atmosphere to obtain an oligomer (14).

0.004 mol of 3,4-dihydro 2H pyrane was added to 0.0125 mol of the oligomer (14) thereby to perform a reaction by making use of a hydrochloric acid catalyst, thereby obtaining an oligomer (15).

TABLE 1

| Oligomer No. | Monomer 1 (ratio) | Monomer 2 (ratio) | Monomer 3 (ratio) | Molecular weight |
|---|---|---|---|---|
| 1 | A (50) | K (50) | | 2,500 |
| 2 | G (50) | L (50) | | Dimer |
| 3 | B (25) | A (25) | I (50) | 4,500 |
| 4 | C (50) | D (50) | | 3,000 |
| 5 | A (50) | E (50) | | 2,500 |
| 6 | A (33) | F (67) | | Trimer |
| 7 | A (33) | H (67) | | Trimer |
| 8 | A (50) | J (50) | | 2,500 |
| 9 | A (50) | M (25) | D (25) | 2,200 |
| 10 | C (50) | N (50) | | 3,500 |
| 11 | I (100) | | | 7-mer or more |
| 12 | I (75) | O (25) | | 2,000 |
| 14 | I (50) | P (50) | | 10-mer or more |

Table 1 also shows the molecular weight of each of these oligomers thus obtained.

0.1 g of tert-butyl malonate was dissolved in THF to prepare a solution, into which 0.1 mol of sodium judrpxode was added at a temperature of −20° C. Then, a THF solution of 0.05 mol of 1,3-dibromoadamantane was dripped into the resultant mixed solution, which was then stirred for 3 hours thereby allowing it to rise in temperature up to room temperature. After the salt generated was separated through filtration, and the resultant reaction solution was extracted with methylene chloride to obtain 1,3-tert-butyl malonate-substituted adamantane. Subsequently, an equimolar amount of acetyl acetone and a trace amount of acetic anhydride-sulfuric acid as a catalyst were added to the substituted adamantane, and the resultant mixture was allowed to polymerize at a temperature of 100° C. for one hour thereby to obtain an oligomer (13) having a molecular weight of 2,500.

(Synthesis of alkali-soluble resin)

Methyl methacrylate (MM), tert-butyl methacrylate (t-BM) and methacrylic acid (MA) were mixed together with tetrahydrofuran (THF) thereby to obtain a mixed solution, to which 10 mol. % of azoisobutyronitrile (AIBN) was added as an initiator. Then, the resultant mixture was allowed to undergo a reaction for 40 hours to obtain a copolymer (MM-t-BM-MA; 35:30:35) having a molecular weight of 7,000.

(Synthesis of polymer of comparative example)

Adamantyl methacrylate (AMM), tert-butyl methacrylate (t-BM) and methacrylic acid (MA) were mixed together with tetrahydrofuran (THF) thereby to obtain a mixed solution, to which 10 mol. % of azoisobutyronitrile (AIBN) was added as an initiator. Then, the resultant mixture was allowed to undergo a reaction for 40 hours to obtain a copolymer (AMM-t-BM-MA; 35:40:25) having a molecular weight of 10,000.

(Synthesis of a solubility-inhibiting agent)

0.1 mol of 1,1" bi-2-naphthol was dissolved in THF to obtain a THF solution which was then allowed to react with a sufficient amount of di-t-butyl 2 carbonate in the presence of 0.22 mole of sodium hydroxide at room temperature with stirring for 4 hours. Then, the reaction solution was poured into a water to form a precipitate, which was then separated through filtration to obtain t-butoxycarbonylized-1,1" bi-2-naphthol (tBocBN).

0.1 mol naphthol equivalent of β-naphthol novolak was dissolved in THF to obtain a THF solution which was then allowed to react with a sufficient amount of di-t-butyl 2 carbonate in the presence of 0.1 mole of sodium hydroxide at room temperature with stirring for 6 hours. Then, the reaction solution was mixed with water and extracted with ethyl acetate to obtain di t-butoxycarbonylized naphthol novolak (tBocNN).

The introduction ratio of t-butoxycarbonyl group in these tBocBN and tBocNN was all 100 mol. % based on all of the hydroxyl group.

(Preparation of resists and formation of resist patterns)

The compounds and solubility-inhibiting agent thus synthesized were dissolved in cyclohexanone together with an photo-acid-generating agent according to the formulations shown in the following Tables 2 and 3, therereby to prepare varnishes of the resists of Examples 1 to 18. The photo-acid-generating agents employed herein were NAT-105, TPS-105 and NAI-105 (naphthalidyl triflate) (Midori Kagaku Co., Ltd.).

TABLE 2

| Example Resist No. | Component 1 (Weight ratio:%) | Component 2 (alkali-soluble resin) | Component 3 (acid-generating ageat) | Component 4 (solubility-inhibiting agent) |
|---|---|---|---|---|
| 1 | Oligmer-1 (99) | | TPS105 (1) | |
| 2 | Oligmer-2 (40) | MM-t-BM-MA (59) | TPS105 (1) | |
| 3 | Oligmer-3 (99) | | TPS105 (1) | |
| 4 | Oligmer-4 (99) | | TPS105 (1) | |
| 5 | Oligmer-5 (99) | | TPS105 (1) | |
| 6 | Oligmer-6 (40) | MM-t-BM-MA (59) | TPS105 (1) | |
| 7 | Oligmer-7 (40) | MM-t-BM-MA (59) | TPS105 (1) | |
| 8 | Oligmer-8 (99) | | TPS105 (1) | |
| 9 | Oligmer-9 (99) | | TPS105 (1) | |

TABLE 3

| Example Resist No. | Component 1 (Weight ratio:%) | Component 2 (alkali-soluble resin) | Component 3 (acid-generating ageat) | Component 4 (solubility-inhibiting agent) |
|---|---|---|---|---|
| 10 | Oligmer-1 (95) | | NAT-105 (5) | |
| 11 | Oligmer-1 (75) | | NAT-105 (5) | tBocBN (20) |
| 12 | Oligmer-1 (75) | | NAT-105 (5) | tBocNN (20) |
| 13 | Oligmer-10 (99) | | NAT-105 (5) | |
| 14 | Oligmer-11 (79) | | TPS-105 (1) | tBocNN (20) |
| 15 | Oligmer-12 (99) | | TPS-105 (1) | |
| 16 | Oligmer-13 (99) | | TPS-105 (1) | |
| 17 | Oligmer-14 (79) | | TPS-105 (1) | tBocNN (20) |
| 18 | Oligmer-15 (95) | | NAT-105 (5) | |
| Comp. Ex. | | AMM-tBM-MA (99) | TPS-105 (1) | |

Thereafter, these varnishes were respectively spin-coated on the surface of an Si wafer to obtain a resist film having a film thickness of 0.5 μm. This resist film was then exposed to a patterning irradiation of ArF excimer laser beam 193 nm in wavelength by making of a stepper (NA=0.54). After the resultant resist film was subjected to a baking treatment for 2 minutes at a temperature of 110° C., the baked resist film was developed with a developing solution consisting of an aqueous alkaline solution of tetramethylammonium hydroxide (TMAH) or consisting of a mixture of TMAH and isopropyl alcohol, thereby selectively dissolving and removing the exposed portions of the resist film. As a result, a resist pattern of positive type was obtained. The concentration of the developing solution, and the sensitivity and resolution of the resist film in this experiment are shown in Table 4.

TABLE 4

| Resist No. | Sensitivity (mJ/cm$^2$) | Resolution (μm) | Processing conditions |
|---|---|---|---|
| 1 | 15 | 0.16 | Thickness: 0.35 μm (the same hereinafter) |
| 2 | 25 | 0.16 | 1.19% aque. sol. Of TMAH |
| 3 | 45 | 0.16 | 1.19% aque. sol. Of TMAH |
| 4 | 20 | 0.17 | 1.19% aque. sol. Of TMAH |
| 5 | 25 | 0.17 | 1.19% aque. sol. Of TMAH |
| 6 | 10 | 0.15 | 1.19% aque. sol. Of TMAH |
| 7 | 15 | 0.15 | 1.19% aque. sol. Of TMAH |
| 8 | 25 | 0.17 | 1.19% aque. sol. Of TMAH |
| 9 | 35 | 0.16 | 1.19% aque. sol. Of TMAH |
| 10 | 55 | 0.15 | 1.19% aque. sol. Of TMAH |
| 11 | 85 | 0.17 | 1.19% aque. sol. Of TMAH |
| 12 | 95 | 0.17 | 1.19% aque. sol. Of TMAH |
| 13 | 23 | 0.15 | 1.19% aque. sol. Of TMAH |
| 14 | 45 | 0.16 | 1.19% aque. sol. Of TMAH |
| 15 | 36 | 0.17 | 1.19% aque. sol. Of TMAH |
| 16 | 25 | 0.17 | 1.19% aque. sol. Of TMAH |
| 17 | 40 | 0.16 | 0.238% aque. sol. Of TMAH |
| 18 | 12 | 0.16 | 0.238% aque. sol. Of TMAH |
| Comp.Ex. | 200 | 0.20 | 2.38% TMAH + isopropanol solution |

As seen from Table 4, it was found that a resist pattern excellent in resolution could be formed with a high sensitivity in all of the resists of Examples 1 to 18, and that these resists were excellent in transparency to a light of 193 nm in wavelength and in alkali-developing property. On the other hand, in the case of the resist of Comparative Example where a developing solution comprising TMAH and 30 wt % of isopropyl alcohol was employed, the sensitivity of the resist was found to be very poor though a resist pattern of excellent resolution was obtained. When only TMAH was employed as a developing solution, it was impossible to perform a development of the resist of this Comparative Example.

EXAMPLE 19

First of all, 0.1 mol of glyoxal trimellitic dihyrate (Aldrich) and 0.1 mol of trans-3,6-endomethylene-1,2,3,6-tetrahydrophthaloyl chloride were mixed together with tetrahydrofuran (THF) thereby to obtain a mixed solution. Then, 0.2 mol of triethylamine was slowly dripped with stirring into this mixed solution at a temperature of 0° C. Thereafter, the resultant mixture was allowed to undergo a reaction at room temperature for 12 hours. The salt precipitated in this reaction was separated by way of filtration, and reaction solution was dripped into water to obtain a polyacetal type polyester oligomer (16) having a molecular weight of 10,000.

The oligomer thus obtained and 1% (based on the oligomer) of TPS-105 were dissolved in cyclohexanone to obtain a cyclohexanone solution, which was then filtered to obtain a resist solution. This resist solution was then spin-coated on the surface of a wafer to obtain a resist film having a film thickness of 0.25 μm. This resist film was then subjected to an exposure by making use of ArF excimer laser beam-generating apparatus. Then, the resultant resist film was prebaked at a temperature of 110° C. and developed with a 2.38% TMAH developing solution. As a result, it was possible with a sensitivity of 55 mJ/cm$^2$ to form a line-and-space pattern having a line width of 0.16 μm.

EXAMPLE 20

0.1 mol of isophorone diisocyanate (Aldrich) and 0.1 mol of deoxycholic acid were mixed together with THF thereby to obtain a mixed solution. Thereafter, the resultant mixed solution was allowed to undergo a reaction with stirring at a temperature of 60° C. for 48 hours. The reaction solution was dripped into water to obtain a polyurethane type oligomer (17) having a molecular weight of 10,000.

The oligomer thus obtained and 5% (based on the oligomer) of 2,3,4,4'-tetrahydroxybenzophenone 4-sulfonate were dissolved in cyclohexanone to obtain a cyclohexanone solution, which was then filtered to obtain a resist solution. This resist solution was then spin-coated on the surface of a wafer to obtain a resist film having a film thickness of 0.25 μm. This resist film was then subjected to an exposure by making use of ArF excimer laser beam-generating apparatus. Then, the resultant resist film was prebaked at a temperature of 120° C. and developed with a 2.38% TMAH developing solution. As a result, it was possible with a sensitivity of 75 mJ/cm² to form a line-and-space pattern having a line width of 0.19 pm.

Followings are additional synthesizing examples and working examples.

(Synthesis No. 1: Synthesis of a polyester compound by a condensation of deoxycholic acid)

Deoxycholic acid was heated with stirring at a temperature of 230° C. for 10 minutes to obtain a copolymer. The resultant copolymer exhibited a broad distribution in molecular weight, the average molecular weight thereof being about 5,000.

(Synthesis No. 2: Synthesis of a compound containing acid anhydride)

Camphoric anhydride and deoxycholic acid were mixed together at an equimolar ratio, and the resultant mixture was heated with stirring at a temperature of 230° C. for 10 minutes to obtain a copolymer. The resultant copolymer exhibited a broad distribution in molecular weight, the average molecular weight thereof being about 5,000.

(Synthesis No. 3: Synthesis comprising a step of reacting a cholic acid with an acid anhydride in a solvent at the initial stage)

1,2-cyclohexane dicarboxylic anhydride and cholic acid were mixed together at an equimolar ratio to obtain 15 g of mixture, and the resultant mixture was then dissolved in 80 g of THF and heated with stirring at a temperature of 60° C. for 100 hours. Thereafter, the reaction solution was allowed to dry to obtain a reaction product. This reaction product was further heated with stirring at a temperature of 230° C. for 10 minutes to obtain a copolymer exhibiting a broad distribution in molecular weight, the average molecular weight thereof being about 6,000.

(Synthesis No. 4: Synthesis employing as a raw material a plurality of hydroxycholic acid derivatives)

Deoxycholic acid, lithocholic acid and 1,2-cyclohexane dicarboxylic anhydride were mixed together at a molar ratio of 1:1:2 to obtain 15 g of mixture, and the resultant mixture was heated with stirring at a temperature of 230° C. for 10 minutes to obtain a copolymer exhibiting a broad distribution in molecular weight, the average molecular weight thereof being about 5,500.

(Synthesis No. 5: Capping of hydroxyl group)

2.5 g of the resin obtained in Synthesis No. 3 was mixed with 30 g of 3,4-dihydro-α-pyrane to obtain a solution, and the resultant solution was stirred for 30 hours to allow a reaction to take place therein. The reaction solution was then allowed to dry to obtain a reaction product exhibiting a broad distribution in molecular weight, the average molecular weight thereof being about 6,100.

EXAMPLE 21

The copolymer obtained in the Synthesis No. 3 and 5 wt % (based on the copolymer) of naphthalidylcamphor sulfonate as a photo-acid-generating agent were mixed together to obtain a mixture, which was then dissolved in cyclohexanone to obtain a 12 wt % cyclohexanone solution. Thereafter, this solution was filtered through a 0.2 μm membrane filter to obtain a resist solution, which was then spin-coated on the surface of an Si wafer. The coated layer was then prebaked at a temperature of 100° C. (for 90 seconds to obtain a resist film having a film thickness of 0.2 μm.

This resist film was then exposed to an irradiation of ArF excimer laser beam (NA=0.55). Then, the exposed resist film was developed with an alkaline developing solution. As a result, it was possible with an exposure dosage of 30 mJ/cm² to form a negative type line-and-space pattern having a line width of 0.25 μm. Furthermore, the pattern thus formed was found excellent in adhesion with the substrate.

EXAMPLE 22

To the copolymer obtained in the Synthesis No. 3 were added 2 wt % (based on the copolymer) of the same kind of photo-acid-generating agent as employed in Example 21 and 2 wt % (based on the copolymer) of 1-naphthol-4-carboxylic acid thereby to obtain a mixture, which was then dissolved in cyclohexanone to obtain a 12 wt % cyclohexanone solution. Thereafter, this solution was filtered through a 0.2 μm membrane filter to obtain a resist solution, which was then spin-coated on the surface of an Si wafer. The coated layer was then prebaked at a temperature of 100° C. for 90 seconds to obtain a resist film having a film thickness of 0.2 μm.

This resist film was then exposed to an irradiation of ArF excimer laser beam (NA=0.55). Then, the resultant resist film was developed with an alkaline developing solution. As a result, it was possible with an exposure dosage of 20 mJ/cm² to form a negative type line-and-space pattern having a line width of 0.25 μm. Furthermore, the pattern thus formed was found excellent in adhesion with the substrate.

EXAMPLE 23

The copolymer obtained in the Synthesis No. 5 and 1 wt % (based on the copolymer) of TPS-105 (Midori Kagaku Co., Ltd.) as a photo-acid-generating agent were mixed together to obtain a mixture, which was then dissolved in cyclohexanone to obtain a 12 wt % cyclohexanone solution. Thereafter, this solution was filtered through a 0.2 μm membrane filter to obtain a resist solution, which was then spin-coated on the surface of an Si wafer. The coated layer was then prebaked at a temperature of 100° C. for 90 seconds to obtain a resist film having a film thickness of 0.2 μm.

This resist film was then exposed to an irradiation of electron beam. Then, the resultant resist film was developed with an alkaline developing solution. As a result, it was possible with an accelerating voltage of 50 kV and an exposure dosage of 30 μC/cm² to form a line-and-space pattern having a line width of 0.20 μm. Furthermore, the pattern thus formed was found excellent in adhesion with the substrate.

EXAMPLE 24

The copolymer obtained in the Synthesis No. 5 and 1 wt % (based on the copolymer) of TPS-105 (Midori Kagaku Co., Ltd.) as a photo-acid-generating agent were mixed together to obtain a mixture, which was then dissolved in cyclohexanone to obtain a 12 wt % cyclohexanone solution. Thereafter, this solution was filtered through a 0.2 μm membrane filter to obtain a resist solution.

On the other hand, a novolak type photoresist was coated on a Si wafer and prebaked at a temperature of 190° C. to form an underlying resist layer having a film thickness of 0.8 µm. Then, the resist solution obtained as mentioned above was spin-coated on the surface of the underlying resist layer. The coated layer was then prebaked at a temperature of 100° C. for 90 seconds to obtain a resist film having a film thickness of 0.2 µm.

This resist film was then exposed to an irradiation of ArF excimer laser beam (NA=0.55). Then, the resultant resist film was developed with an alkaline developing solution. As a result, it was possible with an exposure dosage of 15 mJ/cm$^2$ to form a negative type line-and-space pattern having a line width of 0.20 µm. Furthermore, the pattern thus formed was found excellent in adhesion with the substrate.

The resists prepared according to Examples 1 to 24 were evaluated with regard to the dry etching resistance thereof by subjecting these resists to a $CF_4$ plasma etching and measuring the etching rate of these resists. As a result, the etching rate of the resist of Comparative Example was found to be 1.2 when the etching rate of a resist comprising novolak resin as a base resin was assumed to be 1.0, whereas the etching rate of the resists of Examples 1 to 24 was found to be in the range of 0.9 to 1.1, all indicating excellent dry etching resistance.

(Synthesis No. 6)

21.0 g (0.1 mol) of 4,4'-diaminodicyclohexyl methane and 200 ml of dried N-methylpyrrolidone were charged into a 500 ml four-necked flask provided with an agitator and a thermometer and purged in advance with nitrogen gas, and then the resultant solution was stirred at room temperature. Thereafter, 21.0 g (0.1 mol) of cis, cis, cis, cis-1,2,3,4-cyclopentane tetracarboxylic dianhydride was added to the solution, and the resultant mixture was stirred for 4 hours at room temperature. Thereafter, the mixture was further stirred for 10 hours at a temperature of 60° C. to obtain a viscous polyamide solution.

To this polyamide solution was added 69 g of 3,4-dihydro-2H-pyrane and a catalytic amount of hydrochloric acid, and the resultant mixture was allowed to react for 7 days at room temperature. Then, this solution was dripped into 2000 ml of methanol, thus precipitating a polymer, which was then taken out through filtration. The polymer thus obtained was dried for 10 hours in a vacuum drier heated to a temperature of 50° C. thereby obtaining 41 g of a transparent polymer having a repeating unit represented by the following chemical formula (A-1). The yield of the polymer was 75%.

of water was added to the solution of adamantanol. Furthermore, 100 ml of toluene was added to the solution of adamantanol, and the resultant mixture was heated to a temperature 130 to 150° C. so as to azeotropically remove water and toluene. After confirming that water and toluene were no more distilled from the solution, the solution was cooled down to room temperature, and 42.0 g (0.2 mol) of cis, cis, cis, cis-1,2,3,4-cyclopentane tetracarboxylic dianhydride was added to the solution. Then, the resultant mixture was further stirred at room temperature for 50 hours. Thereafter, the reaction solution was cooled with water and a diluted hydrochloric acid was dripped little by little into the reaction solution thus making it weakly acid.

Then, this solution was filtered and dripped into 200 ml of water, thus precipitating diester dicarboxylic acid, which was then taken out through filtration. The diester dicarboxylic acid thus obtained was dried under an atmosphere of reduced pressure, thereby obtaining diester dicarboxylic acid. The yield of the diester dicarboxylic acid was 35% (36 g).

Then, 30.1 g (0.06 mol) of diester dicarboxylic acid, 12.6 g (0.06 mol) of 4,4'-diaminodicyclohexyl methane and 12.5 g of trimethylamine were dissolved in 100 ml of N-methylpyrrolidone in a 500 ml four-necked flask provided with an agitator and a thermometer and purged in advance with nitrogen gas.

The resultant solution was cooled down to –10° C. and then 45.2 g of the compound represented by the following chemical formula and dissolved in 80 ml of N-methylpyrrolidone was dripped into the solution. The resultant mixture was then stirred for 30 minutes.

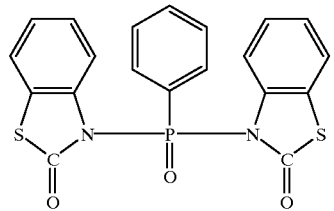

Additionally, the mixture was stirred again at room temperature for 20 hours, and insoluble matters were removed by means of filtration. The resultant filtrate was poured into

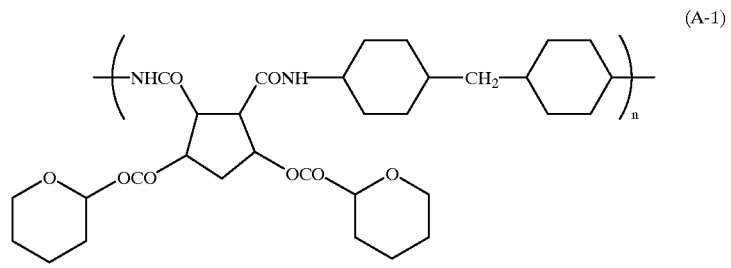

(A-1)

(Synthesis No. 7)

61 g of 1-adamantanol and 200 ml of N-methylpyrrolidone were charged into a 500 ml four-necked flask provided with an agitator and a thermometer and purged in advance with nitrogen gas, and then the resultant solution was stirred at room temperature. Thereafter, 27 g of potassium hydroxide dissolved in 50 ml 2,000 ml of methanol, thereby allowing a polymer to precipitate, which was then taken out by means of filtration. The polymer thus obtained was dried for 10 hours in a vacuum drier heated to a temperature of 50° C., thereby obtaining 33 g of a transparent polymer having a repeating unit represented by the following chemical formula (A-2). The yield of the polymer was 80%.

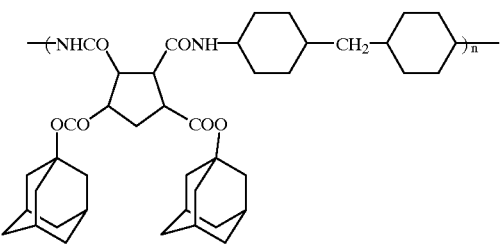

(Synthesis No. 8)

30.2 g (0.1 mol) of acid anhydride represented by the following chemical formula, 22.4 g (0.2 mol) of potassium-tert-butoxide, and 200 ml of dried N,N-dimethylacetamide were charged into a 500 ml four-necked flask provided with an agitator and a thermometer and purged in advance with nitrogen gas, and then the resultant solution was stirred at room temperature for 20 hours thereby allowing the mixture to react with each other. Thereafter, the reaction solution was cooled with water and a diluted hydrochloric acid was dripped little by little into the reaction solution thus making it weakly acid.

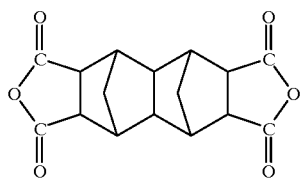

Then, this solution was filtered and dripped into 2000 ml of water, thus precipitating diester dicarboxylic acid, which was then taken out through filtration. The diester dicarboxylic acid thus obtained was dried under an atmosphere of reduced pressure, thereby obtaining diester dicarboxylic acid. The yield of the diester dicarboxylic acid was 76% (34 g).

Then, 31.5 g (0.07 mol) of diester dicarboxylic acid, 11.5 g (0.07 mol) of an diepoxy compound represented by the following chemical formula, and 2 g of triphenylphosphine were dissolved in 200 ml of dried N,N-dimethylacetamide in a 500 ml four-necked flask provided with an agitator and a thermometer and purged in advance with nitrogen gas. The resultant solution was then allowed to react at a temperature of 100° C. for 2 hours.

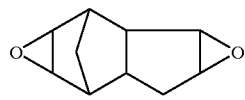

The resultant solution was filtered and poured into 2,000 ml of methanol, thereby allowing a polymer to precipitate, which was then taken out by means of filtration. The polymer thus obtained was dried for 10 hours in a vacuum drier heated to a temperature of 50° C., thereby obtaining 34 g of a transparent polymer (A-3). The yield of the polymer was 80%.

EXAMPLE 25

10 g of the transparent polymer (A-1) and 0.2 g of triphenylsulfonium trifluoromethanesulfonate were dissolved in 20 g of ethyl lactate, and the resultant solution was filtered through a 0.5 μm membrane filter thereby to obtain a photosensitive composition. Thereafter, this photosensitive composition was coated on the surface of an Si wafer. The coated layer was then heated at a temperature of 100° C. for 60 seconds to dry the coated layer, thus obtaining a resist film having a film thickness of 10 μm.

This resist film was then exposed via a mask having a prescribed pattern to a light of mercury lamp. Then, the resultant resist film was prebaked over a hot plate at a temperature of 95° C. for 3 minutes. Then, the resist film was subjected to a developing treatment by immersing it in a 2.38% aqueous solution of tetramethylammonium hydroxide for 90 seconds, and then washing it with water, thus obtaining a resist pattern.

When a section of this resist pattern was observed by means of a scanning type electron microscope (SEM), it was confirmed that a rectangular pattern having a line width of 2 μm could be formed with an exposure dosage of 200 mJ/cm$^2$. Subsequently, the substrate bearing this resist pattern was heated at a temperature of 200° C. for 2 hours thereby to imidize the resist, thus obtaining a heat resistant pattern.

EXAMPLE 26

10 g of the transparent polymer (A-1) and 0.15 g of di(paratertiary butylphenyl) iodoniumtrifluoromethane sulfonate were dissolved in 50 g of ethyl lactate, and the resultant solution was filtered through a 0.2 μm membrane filter thereby to obtain a photosensitive composition. Thereafter, this photosensitive composition was coated on the surface of an Si wafer. The coated layer was then heated at a temperature of 100° C. for 60 seconds to dry the coated layer, thus obtaining a resist film having a film thickness of 0.8 μm.

This resist film was then exposed via a mask having a prescribed pattern to a KrF excimer laser beam. Then, the resultant resist film was prebaked over a hot plate at a temperature of 100° C. for 90 seconds. Then, the resist film was subjected to a developing treatment by immersing it in a 2.38% aqueous solution of tetramethylammonium hydroxide for 90 seconds, and then washing it with water, thus obtaining a resist pattern.

When a section of this resist pattern was observed by means of a scanning type electron microscope (SEM), it was confirmed that a rectangular pattern having a line width of 0.25 μm could be formed with an exposure dosage of 88 mJ/cm$^2$.

EXAMPLE 27

10 g of the transparent polymer (A-3), 0.1 g of triphenylsulfoniumtrifluoromethane sulfonate and 0.075 g of 4-phenylpyridine were dissolved in 50 g of methyl 3-methoxypropionate, and the resultant solution was filtered through a 0.2 μm membrane filter thereby to obtain a photosensitive composition. Thereafter, this photosensitive composition was coated on the surface of an Si wafer. The coated layer was then heated at a temperature of 100° C. for 60 seconds to dry the coated layer, thus obtaining a resist film having a film thickness of 0.5 μm.

This resist film was then exposed via a mask having a prescribed pattern to an ArF excimer laser beam by making use of a reduced projection type exposure apparatus as a light source. Then, the resultant resist film was prebaked over a hot plate at a temperature of 100° C. for 90 seconds. Then, the resist film was subjected to a developing treatment by immersing it in a 2.38% aqueous solution of tetramethylammonium hydroxide for 60 seconds, and then washing it with water, thus obtaining a resist pattern.

When a section of this resist pattern was observed by means of a scanning type electron microscope (SEM), it was confirmed that a rectangular pattern having a line width of 0.15 μm could be formed with an exposure dosage of 120 mJ/cm$^2$.

When the above photosensitive composition was coated on the surface of a quartz wafer to a thickness of 1 μm and the absorbency thereof to a light of 193 nm in wavelength was measured, the absorbency of the coated film was found to be 0.44.

COMPARATIVE EXAMPLE 2

A photosensitive composition was prepared in the same manner as explained in Example 27 except that 4-phenylpyridine was not employed in this Comparative Example. Then, a resist pattern was formed by making use of this photosensitive composition and by performing the exposure and development in the same manner as explained in Example 27.

When a section of this resist pattern was observed by means of SEM, an overhanging undissolved portion was recognized at an upper portion of the pattern, i.e. the etching depth of this portion of only 0.05 μm.

EXAMPLE 28

10 g of the transparent polymer (A-1) and 0.5 g of triphenylsulfoniumtrifluoromethane sulfonate were dissolved in 50 g of methyl 3-methoxypropionate, and the resultant solution was filtered through a 0.2 μm membrane filter thereby to obtain a photosensitive composition. Thereafter, this photosensitive composition was coated on the surface of an Si wafer. The coated layer was then heated at a temperature of 100° C. for 60 seconds to dry the coated layer, thus obtaining a resist film having a film thickness of 0.5 μM.

This resist film was then exposed via a mask having a prescribed pattern to an ArF excimer laser beam by making use of a reduced projection type exposure apparatus as a light source. Then, the resultant resist film was prebaked over a hot plate at a temperature of 100° C. for 90 seconds. Then, the resist film was subjected to a developing treatment by immersing it in a 2.38% aqueous solution of tetramethylammonium hydroxide for 60 seconds, and then washing it with water, thus obtaining a resist pattern.

When a section of this resist pattern was observed by means of SEM, it was confirmed that a rectangular pattern having a line width of 0.17 μm could be formed with an exposure dosage of 220 mJ/cm$^2$.

When the above photosensitive composition was coated on the surface of a quartz wafer to a thickness of 1 μm and the absorbency thereof to a light of 193 nm in wavelength was measured, the absorbency of the coated film was found to be 0.60.

COMPARATIVE EXAMPLE 3

5 g of the transparent polymer (A-1) and 5 g of polyhydroxystyrene where tert-butoxycarbonyloxy group was substituted for the hydroxyl group, and 0.5 g of triphenylsulfoniumtrifluoromethane sulfonate were dissolved in 50 g of methyl 3-methoxypropionate, and the resultant solution was filtered through a 0.2 μm membrane filter thereby to obtain a photosensitive composition. Thereafter, this photosensitive composition was coated on the surface of an Si wafer. The coated layer was then heated at a temperature of 100° C. for 60 seconds to dry the coated layer, thus obtaining a resist film having a film thickness of 0.5 μm.

This resist film was then exposed via a mask having a prescribed pattern to an ArF excimer laser beam by making use of a reduced projection type exposure apparatus as a light source. Then, the resultant resist film was prebaked over a hot plate at a temperature of 100° C. for 90 seconds. Then, the resist film thus heat-treated was subjected to a developing treatment by immersing it in a 2.38% aqueous solution of tetramethylammonium hydroxide for 60 seconds, and then washing it with water, thus obtaining a resist pattern.

When a section of this resist pattern was observed by means of SEM, a pattern having a line width of 0.4 μm was found as being formed with an exposure dosage of 190 mJ/cm$^2$. However, the shape thereof was triangular and film thickness was reduced to 0.3 μm.

When the above photosensitive composition was coated on the surface of a quartz wafer to a thickness of 1 μm and the absorbency thereof to a light of 193 nm in wavelength was measured, the absorbency of the coated film was found to be 3.1.

EXAMPLE 30

Cresol novolak resin, acrylic resin and the photosensitive composition of this invention were compared with each other regarding the etching rate thereof. Specifically, the cresol novolak resin was dissolved in ethyl lactate, and filtered through a 0.5 μm membrane filter thereby to obtain a resist solution. Likewise, acrylic resin was dissolved in ethyl lactate, and filtered through a 0.5 μm membrane filter thereby to obtain a resist solution.

As for the photosensitive composition of this invention, the photosensitive compositions prepared in Examples 26 to 28 were employed in this experiment.

These five kinds of solutions were respectively coated on the surface of a silicon wafer thereby to form a film having a thickness of 1 μm respectively.

Then, the etching of each resist film was performed under the conditions of: 20 sccm of CF$_4$, 5 sccm of H$_2$, 0.005 Torr, and 170 W in output. The etching rates thus measured are shown in the following Table 5.

TABLE 5

| Resin | Etching rate |
| --- | --- |
| Cresol novolak resin | 18 nm/min |
| Acryl resin | 87 |
| Photosensitive composition of Ex. 26 | 29 |
| Photosensitive composition of Ex. 27 | 21 |
| Photosensitive composition of Ex. 28 | 25 |

It was confirmed that although the photosensitive compositions prepared in Examples 26 to 28 were inferior regarding the dry etching resistance as compared with the cresol novolak resin, but superior as compared with the acrylic resin, i.e. the dry etching resistance of the compositions prepared in Examples 26 to 28 was almost comparable to that of polyhydroxystyrene.

EXAMPLE 31

When the reaction time of the oligomer (11) was further extended to 60 minutes, the polymerization (curing) of the oligomer was further proceeded, thus obtaining an oligomer having a molecular weight of 5,000. This resin was confirmed, through a thermal analysis thereof, as being a high heat resistant resin having a $T_g$ of 230° C. or more.

The infrared absorption spectrum of the oligomer thus obtained was measured, the results being shown in FIG. 1. As shown in FIG. 1, an absorption of ester was admitted at a wavelength of 1740 cm$^{-1}$, indicating the presence of polyester.

EXAMPLE 32

When poly(isocyanate) which was synthesized according to the procedures of Example 20 was thermally analyzed, the heat resistance of the polymer was 200° C. or more. It was also confirmed that when this resin was further heated, the curing of the resin could be further promoted while releasing carbon dioxide gas.

Figure 2:
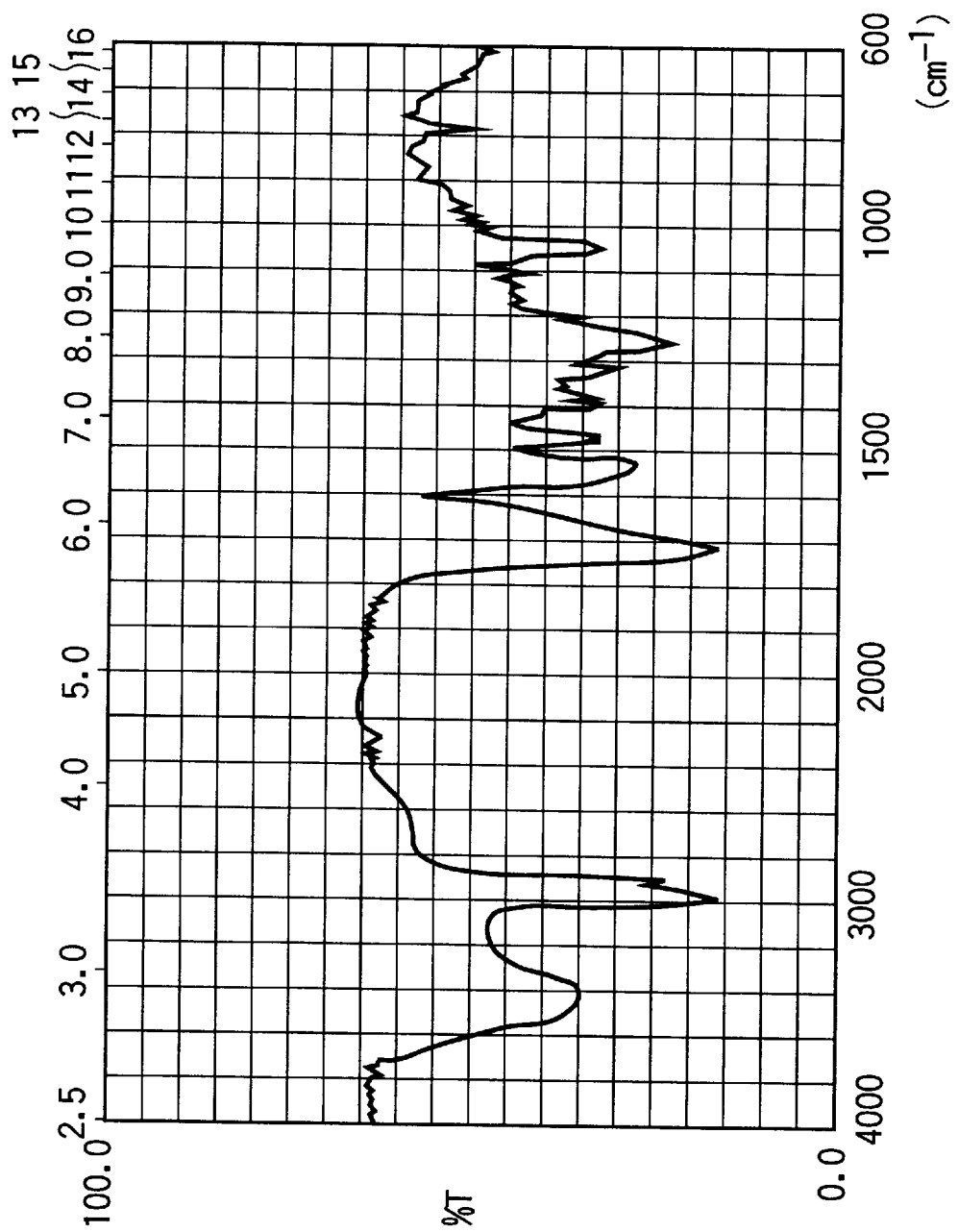
FIG. 2 shows an infrared absorption spectrum of an oligomer which has been synthesized in Example 32.

The infrared absorption spectrum of the oligomer thus obtained was measured, the results being shown in FIG. 2. As shown in FIG. 2, an absorption of isocyanate was not admitted, and the absorption of urethane was admitted at a wavelength of 1700 cm$^{-1}$ and at a wavelength of 1520 cm$^{-1}$, indicating the presence of polyurethane.

As explained above, it is possible according to this invention to provide a photosensitive composition and a method of forming a resist pattern which enables to form a resist pattern which is excellent in transparency to the light of short wavelength and in dry etching resistance, and capable of forming a fine resist pattern of excellent resolution by making use of an alkaline development. It is possible according to this invention to provide a transparent resin which is suited for use as an optical material or as a coating material.

Furthermore, the photosensitive composition of this invention is excellent in solubility to a coating solvent and free from phase separation. Therefore, the photosensitive composition of this invention is quite useful for the photolithography to be employed in the fine working of a high density electronic device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. A photosensitive composition comprising an oligomer having a backbone chain comprising an alicyclic constituent skeleton and/or a conjugated polycondensed aromatic constituent skeleton, wherein said alicyclic constituent skeleton and said aromatic constituent skeleton are linked with each other via an acid-decomposable linkage and said backbone chain being acid-decomposable or hydrolyzable; and a photo-acid generating agent.

2. The photosensitive composition according to claim 1, wherein said oligomer contains an acid anhydride linkage in its backbone chain.

3. The photosensitive composition according to claim 1, wherein said oligomer contains an acid-decomposable deprotecting group on its side chain.

4. The photosensitive composition according to claim 1, which further comprises a solubility-inhibiting agent.

5. The photosensitive composition according to claim 4, wherein said solubility-inhibiting agent is selected from the group consisting of t-butoxycarbonylized-1,1'-bis-2-naphthol (tBocBn) and di-t-butoxycarbonylized naphthol novolak (tBocNn).

6. The photosensitive composition according to claim 1, which further comprises a nitrogen-containing basic compound.

7. The photosensitive composition of claim 1, wherein said alicyclic constituent skeleton is selected from the group consisting of a cyclic compound represented by formula $C_nH_{2n}$, a cyclic compound, a tricyclic compound and condensed rings of said bicyclic compounds;

where n is an integer of 3 or more.

8. The photosensitive composition of claim 1, wherein said alicyclic constituent skeleton is selected from the group consisting of a monocyclic compound, monocyclic compounds attached with a bridging hydrocarbon, a spiro ring compound, a terpene ring compound, a steroid skeleton compound, bile acid; digitaloid; camphoric ring; isocamphoric ring; sesquiterpene; santonic ring; diterpene; triterpene; and steroidsaponin.

9. The photosensitive composition of claim 8, wherein said monocyclic compound is selected from the group consisting of cyclopentane, cyclohexane, and cycloheptane; wherein said monocyclic compounds attached with a spiro ring are selected from the group consisting of spiroheptane and spirooctane; wherein said terpene ring compound is selected from the group consisting of norbornyl, adamanthyl, bornene, methyl and menthane; wherein said steroid skeleton compound is selected from the group consisting of thujane, sabinene, thujone, carane, pinane, norpinane, bornane, fenchane, tricyllene and cholesteric ring.

10. The photosensitive composition of claim 1, wherein said conjugated polycondensed aromatic constituent skeleton comprises a compound selected from the group consisting of a naphthalene ring, anthracene ring, phenanthrene ring, pyrene ring, naphthacene ring, perylene ring, pentacene ring, picene ring, pyrrole ring, benzofuran ring, benzothiophene ring, indole ring, benzoxazole ring, benzothiazole ring, indazole ring, chromene ring, quinoline cinnoline ring, phthalazine ring, quinazoline ring, dibenzofuran ring, carbazole ring, acridine ring, phenanthridine ring, phenanthroline ring, phenazine ring, thianthrene ring, indolizine ring, naphthyridine ring, purine ring, pteridine ring and fluorene ring.

11. The photosensitive composition of claim 1, wherein said conjugated polycondensed aromatic constituent skeleton comprises a compound selected from the group consisting of a naphthalene ring, an anthracene ring, and a phenanthrene ring.

12. The photosensitive composition according to claim 1, wherein the photo-acid generating agent is selected from the group consisting of NAT-105, NAI-105 and TPS-105.

13. A photosensitive composition comprising an oligomer having a backbone chain comprising an alicyclic skeleton and/or a conjugated polycondensed aromatic skeleton, said backbone chain being acid-decomposable or hydrolyzable; and a photo-acid-generating agent; wherein said oligomer contains an ester linkage in its backbone chain.

14. The photosensitive composition according to claim 13, wherein carbon atom bonded to oxygen atom in said ester linkage is formed of a tertiary carbon atom including alkyl group.

15. The photosensitive composition according to claim 14, wherein said oligomer further contains an acid anhydride linkage in its backbone chain.

16. The photosensitive composition according to claim 15, wherein said oligomer contains an acid-decomposable deprotecting group on its side chain.

17. The photosensitive composition according to claim 16, which further comprises a solubility-inhibiting agent.

18. The photosensitive composition according to claim 15, which further comprises a solubility-inhibiting agent.

19. The photosensitive composition according to claim 14, wherein said oligomer contains an acid-decomposable deprotecting group on its side chain.

20. The photosensitive composition according to claim 14, which further comprises a solubility-inhibiting agent.

21. The photosensitive composition according to claim 14, wherein said oligomer is a compound represented by the following general formula (9):

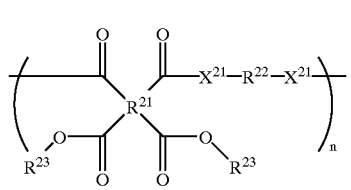

wherein $X^{21}$ is oxygen atom; $R^{21}$ is a tetra-valent organic group having an alicyclic skeleton or a conjugated polycondensed aromatic skeleton; $R^{22}$ is a bi-valent organic group having an alicyclic skeleton or a conjugated polycondensed aromatic skeleton; $R^{23}$ is hydrogen atom or mono-valent organic group; and n is an integer.

22. The photosensitive composition according to claim 4, which further comprises a nitrogen-containing basic compound.

23. The photosensitive composition according to claim 13, wherein said oligomer further contains an acid anhydride linkage in its backbone chain.

24. The photosensitive composition according to claim 13, wherein said oligomer contains an acid-decomposable deprotecting group on its side chain.

25. The photosensitive composition according to claim 13, which further comprises a solubility-inhibiting agent.

26. The photosensitive composition according to claim 13, wherein said oligomer is a compound represented by the following general formula (9):

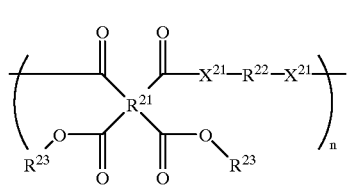

wherein $X^{21}$ is oxygen atom; $R^{21}$ is a tetra-valent organic group having an alicyclic skeleton or a conjugated polycondensed aromatic skeleton; $R^{22}$ is a bi-valent organic group having an alicyclic skeleton or a conjugated polycondensed aromatic skeleton; $R^{23}$ is hydrogen atom or mono-valent organic group; and n is an integer.

27. The photosensitive composition according to claim 13, which further comprises a nitrogen-containing basic compound.

28. A photosensitive composition comprising an oligomer compound comprising an alicyclic skeleton having carboxyl group and hydroxyl group, or a conjugated polycondensed aromatic skeleton having carboxyl group and hydroxyl group; and a compound capable of generating an acid when irradiated with an actinic radiation.

29. The photosensitive composition according to claim 28, wherein said oligomer comprising an alicyclic skeleton having carboxyl group and hydroxyl group is: a compound having a steroid skeleton containing both hydroxyl group and carboxyl group; or an ester oligomer.

30. The photosensitive composition according to claim 29, which further comprises a crosslinking agent.

31. The photosensitive composition according to claim 29, which further comprises a nitrogen-containing basic compound.

32. The photosensitive composition according to claim 29, wherein said compound having a steroid skeleton containing both hydroxyl group and carboxyl group; or said ester oligomer is a compound derived by esterifying a carboxylic acid or a compound selected from the group consisting of succinic anhydride, maleic anhydride, citraconic anhydride, 1,2-cyclohexane dicarboxylic anhydride, camphoronic anhydride, phthalic anhydride, pyromellitic anhydride, mellitic anhydride, chlorophthalic anhydride, dichlorophthalic anhydride, tetrachlorophthalic anhydride, 3-nitrophthalic anhydride and a hydrogenated product of these compounds.

33. The photosensitive composition according to claim 32, which further comprises a crosslinking agent.

34. The photosensitive composition according to claim 33, which further comprises a nitrogen-containing basic compound.

35. The photosensitive composition according to claim 28, wherein said oligomer is a compound derived by esterifying a carboxylic acid or a compound selected from the group consisting of succinic anhydride, maleic anhydride, citraconic anhydride, 1,2-cyclohexane dicarboxylic anhydride, camphoronic anhydride, phtalic anhydride, pyromellitic anhydride, mellitic anhydride, chlorophthalic anhydride, dichlorophthalic anhydride, tetrachlorophthalic anhydride, 3-nitrophthalic anhydride and a hydrogenated product of these compounds.

36. The photosensitive composition according to claim 35, which further comprises a crosslinking agent.

37. The photosensitive composition according to claim 36, which further comprises a nitrogen-containing basic compound.

38. The photosensitive composition according to claim 28, which further comprises a nitrogen-containing basic compound.

39. A transparent resin comprising an ester oligomer having a hydroxy cholane skeleton, a polyisocyanate having a hydroxy cholane skeleton, or an oligomer represented by the following general formula (11);

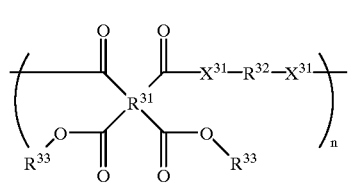

wherein $X^{31}$ is NH or O; $R^{31}$ is a tetra-valent organic group having an alicyclic skeleton or a conjugated polycondensed aromatic skeleton; $R^{32}$ is a bi-valent organic group having an alicyclic skeleton or a conjugated polycondensed aromatic skeleton; $R^{33}$ is hydrogen atom or mono-valent organic group; and n is an integer.

40. The photosensitive composition, which comprises a transparent resin as described in claim 39; a compound having a polyamide structure, and a photo-acid-generating agent.

41. The photosensitive composition according to claim 40, which further comprises a nitrogen-containing basic compound.

42. A method of forming a pattern, which comprises the steps of:

forming a resin layer comprising a photosensitive compositions as claimed in claim 1 on a substrate;

irradiating an actinic radiation onto a predetermined region of said resin layer;

heat-treating said resin layer irradiated with said actinic radiation; and developing said resin layer after said heat-treatment so as to selectively remove an irradiated portion or un-irradiated portion of said resin layer.

43. A method of forming a pattern, which comprises the steps of:

forming a resin layer comprising a photosensitive compositions as claimed in claim 28 on a substrate;

irradiating an actinic radiation onto a predetermined region of said resin layer;

heat-treating said resin layer irradiated with said actinic radiation; and developing said resin layer after said heat-treatment so as to selectively remove an irradiated portion or un-irradiated portion of said resin layer.

* * * * *